US012787329B2

(12) United States Patent
Cui et al.

(10) Patent No.: US 12,787,329 B2
(45) Date of Patent: Nov. 3, 2026

(54) SEMICONDUCTOR DEVICE AND FABRICATION METHODS THEREOF

(71) Applicants: Peng Cui, Jinan (CN); Yuping Zeng, Newark, DE (US)

(72) Inventors: Peng Cui, Jinan (CN); Yuping Zeng, Newark, DE (US)

(73) Assignee: University of Delaware, Newark, DE (US)

( * ) Notice: Subject to any disclaimer, the term of this patent is extended or adjusted under 35 U.S.C. 154(b) by 880 days.

(21) Appl. No.: 17/836,487

(22) Filed: Jun. 9, 2022

(65) Prior Publication Data

US 2022/0399458 A1 Dec. 15, 2022

Related U.S. Application Data

(60) Provisional application No. 63/208,529, filed on Jun. 9, 2021.

(51) Int. Cl.

| | |
|---|---|
| ***H10D 30/01*** | (2025.01) |
| ***H10D 30/47*** | (2025.01) |
| ***H10D 62/85*** | (2025.01) |
| ***H10P 14/20*** | (2026.01) |

(Continued)

(52) U.S. Cl.
CPC ......... *H10D 30/015* (2025.01); *H10D 30/475* (2025.01); *H10D 62/8503* (2025.01);
(Continued)

(58) Field of Classification Search
CPC ............... H10D 30/015; H10D 30/475; H10D 30/4732; H10D 62/8503; H10D 62/117;
(Continued)

(56) References Cited

U.S. PATENT DOCUMENTS

2010/0264401 A1* 10/2010 Adivarahan ......... H10H 20/825 438/47
2020/0176593 A1* 6/2020 Derluyn ............... H10D 64/693
2022/0102344 A1* 3/2022 Then .................... H10D 62/119

OTHER PUBLICATIONS

Lee et al. "Low resistance Ohmic contacts to n-GaN by Ar plasma and forming gas ambient treatments" published Jul. 24, 2003, Journal of Vacuum Science & Technology B 21, 1501 (2003); doi: 10.1116/1.1596217 , © 2003 American Vacuum Society (Year: 2003).*

(Continued)

*Primary Examiner* — Sitaramarao S Yechuri
(74) *Attorney, Agent, or Firm* — Buchanan Ingersoll & Rooney PC

(57) ABSTRACT

A semiconductor device and fabricating method thereof is disclosed. The method comprises depositing epitaxial layers over a silicon substrate to form a semiconductor layer surface; forming at least one mesa portion on the semiconductor layer surface; depositing a metal stack on the semiconductor layer surface; subjecting the semiconductor layer surface to a rapid thermal annealing system for a two-step ohmic contact annealing in $H_2/N_2$ forming gas (FG) and then nitrogen; subjecting the semiconductor layer surface to an oxygen plasma treatment; and depositing a T-shaped metal gate on the semiconductor layer surface. A semiconductor device comprises a semiconductor layer surface having an epitaxial layer disposed over a silicon substrate; at least one mesa portion formed on the semiconductor layer surface; a metal stack, disposed on the semiconductor layer surface, and sequentially annealed in FG and nitrogen; and a T-shaped metal gate on the semiconductor layer surface.

26 Claims, 15 Drawing Sheets

(51) Int. Cl.
*H10P 14/60* (2026.01)
*H10P 95/90* (2026.01)

(52) U.S. Cl.
CPC ...... *H10P 14/3216* (2026.01); *H10P 14/3416* (2026.01); *H10P 14/6334* (2026.01); *H10P 14/6349* (2026.01); *H10P 95/904* (2026.01)

(58) Field of Classification Search
CPC .......... H10D 64/0116; H01L 21/02271; H01L 21/02293; H01L 21/02458; H01L 21/0254; H01L 21/3245; H01L 21/28575; H10P 14/3216; H10P 14/3416; H10P 14/6334; H10P 14/6349; H10P 95/904
See application file for complete search history.

(56) References Cited

OTHER PUBLICATIONS

Duan et al., "Interfacial chemistry and valence band offset between GaN and Al2O3 studied by X-ray photoelectron spectroscopy," Applied Physics Letters, 2013, vol. 102, pp. 201604-1-201604-4.
Kushvaha et al., "Structural, optical and electronic properties of homoepitaxial GaN nanowalls grown on GaN template by laser molecular beam epitaxy," RSC Advances, 2015, vol. 5, pp. 87818-87830.
Lin et al., "Investigation of surface treatments for nonalloyed ohmic contact formation in Ti/Al contacts to n-type GaN," Applied Physics Letters, 2000, vol. 77, pp. 3986-3988.
Mishra et al., "Pit assisted oxygen chemisorption on GaN surfaces," Physical Chemistry Chemical Physics, 2015, vol. 17, pp. 15201-15208.
Song et al., "Self-consistent growth of single-crystalline (201) β-Ga2O3 nanowires using a flexible GaN seed nanocrystal," CrystEngComm, 2017, vol. 19, pp. 625-631.
Wang et al., "Interface engineering of an AlNO/AlGaN/GaN MIS diode induced by PEALD alternate insertion of AlN in Al2O3," RSC Advances, 2017, vol. 7, pp. 11745-11751.
Tinkle et al., "Detection of Ga suboxides and their impact on III-V passivation and Fermi-level pinning," Applied Physics Letters, 2009, vol. 94, 3 pages.
Altuntas et al., "Power Performance at 40 GHz of AlGaN/GaN high-electron mobility transistors grown by molecular beam epitaxy on Si(111) substrate", IEEE Electron Device Letters, vol. 36, No. 4, Apr. 2015, 3 pages.
Ambacher et al., "Two dimensional electron gases induced by spontaneous and piezoelectric polarization undoped and doped AlGaN/GaN heterostructures", Journal of Applied Physics, vol. 87, No. 1, Jan. 1, 2000, 12 pages.
Arulkumaran, S., "Record-low contact resistance for InAlN/AlN/GaN high electron mobility transistors on Si with non-gold metal", Jpn. J. Appl. Phys., 54, 04DF12, 6 pages.
Bouzid et al., "435mS/mm transconductance for AlGaN/GaN HEMTs on HR-Si substrate with optimized gate-source spacing", Electronic Letters, Jan. 19, 2012, vol. 48, No. 2, 2 pages.
Bouzid-Driad et al., "AlGaN/GaN HEMTs on silicon substrate with 206-GHz FMAX", IEEE Electron Device Letters, vol. 34, No. 34, Jan. 1, 2013, 3 pages.
Christy et al., "High fT and fMAX for 100 nm unpassivated rectangular gate AlGaN/GaN HEMT on high resistive silicon (111) substrate", Electronic Letters, Aug. 20, 2015, vol. 51, No. 17, pp. 1366-1368.
Cui, P., "High-performance InAlN/GaN HEMTs on silicon substrate with high fTxLg", Appl. Phys. Express, 12, 104001, 2019, 5 pages.
Cui et al., "InAlN/GaN HEMT on Si with fMAX=270 GHz", IEEE Transaction on Electron Devices, vol. 68, No. 3, Mar. 2021, 6 pages.
Goyal, N., "Analytical modeling of AlGaN/AlN/GaN heterostructures including effects of distributed surface donor states", Applied Physics Letters, 105, 023508, 2014, 6 pages.
Huang et al., "Effective passivation of AlGaN/GaN HEMTs by ALD-grown ALN Thin Film", IEEE Electron Device etters, vol. 33, No. 4, Apr. 2012, 3 pages.
Huang et al., "High uniformity normally-OFF GaN MIS-HEMTs fabricated on ultra-thin-barrier AlGaN/GaN heterostructure", IEEE Electron Device Letters, vol. 37, No. 12, Dec. 2016, 4 pages.
Huang et al., "High-fMAX high Johnson's Figure of Merit 0.2-um gate AlGaN/GaN HEMTs on Silicon Substrate with AlN/SiNx Passivation", IEEE Electron Device Letters, vol. 35, No. 3, Mar. 2014, 3 pages.
Ibbetson et al., "Polarization effects, surface states, and the source of electrons in AlGaN/GaN heterostructure field effect transistors", Applied Physics Letters, vol. 77, No. 2, Jul. 10, 2000, 3 pages.
Ichikawa et al., "AlGaN/GaN HEMTs versus InAlN/GaN HEMTs", Proceedings of Asia-Pacific Microwave Conference 2014, downloaded Sep. 30, 2022, 3 pages.
Jatal et al., "High-Frequency Performance of GaN High-Electron Mobility Transistors on 3C—SiC/Si Substrates with AU-free Ohmic Contacts", IEEE Electron Device Letters, vol. 36, No. 2, Feb. 2015, 3 pages.
Jogai, B., "Influence of surface states on the two-dimensional electron gas in AlGaN/GaN heterojunction field-effect transistors", Journal of Applied Physics, 93, 2003, pp. 1631-1635.
Kuzmik, J., "Power electronics on InAlN/(In)GaN: Prospect for a Record Performance", IEEE Electron Device Letters, vol. 22, No. 11, Nov. 2001, 3 pages.
Li et al., "GaN HEMTs on Si with Regrown Contacts and Cutoff/Maximum Oscillation Frequencies of 250/204 GHz", IEEE Electron Device Letters, vol. 41, No. 5, May 2020, 4 pages.
Lin et al., "AlGaN/GaN HEMTs with Low Leakage Current and High On/Off Current Ratio", IEEE Electron Device Letters, vol. 31, No. 2, Feb. 2010, 3 pages.
Marti et al., "94-GHz Large-Signal Operation of AllnN/GaN High-Electron-Mobility Transistors on Silicon with Regrown Ohmic Contacts", IEEE Electron Device Letters, vol. 36, No. 1, Jan. 2015, 3 pages.
Marti et al., "150-GHz Cutoff Frequencies and 2-W/mm Output Power at 40 GHz in a Millimeter-Wave AlGaN/GaN HEMT Technology on Silicon", IEEE Electron Device Letters, vol. 33, No. 10, Oct. 2012, 3 pages.
Medjdoub et al., "Beyond 100 GHz AlN/GaN HEMTs on Silicon Substrate", Electronic Letters, Nov. 2011, 3 pages.
Medjdoub et al., "Low-Noise Microwave Performance of AlN/GaN HEMTs Grown on Silicon Substrate", IEEE Electron Device Letters, vol. 32, No. 9, Sep. 2011, 3 pages.
Medjdoub et al., "Sub-1-dB Minimum-Noise-Figure Performance of GaN-on-Si Transistors Up to 40 GHz", IEEE Electron Device Letters, vol. 33, No. 19, Sep. 2012, 3 pages.
Murase et al., "T-Shaped Gate GaN HFETs on Si with Improved Breakdown Voltage and fMAX", IEEE Electron Device Letters, vol. 35, No. 5, May 2014, 3 pages.
Onojima et al., "Reduction in potential barrier height of AlGaN/GaN heterostructures by SiN passivation", J. Appl. Phys., 101, 043703, 2007, 7 pages.
Ramvall et al., "Influence of a piezoelectric field on the electron distribution in a double GaN/Al0.14Ga0.86N Heterojunction", Appl. Phys. Lett., 74, 3866, 1999, 4 pages.
Schuette et al., "Gate-Recessed Integrated E/D GaN HEMT Technology with fT/fMAX>300 GHz", IEEE Electron Device Letters, vol. 34, No. 6, Jun. 2013, 3 pages.
Soltani et al., "Power Performance of AlGaN/GaN High-Electron-Mobility Transistors on (110) Silicon Substrate at 40 GHz", IEEE Electron Device Letters, vol. 34, No. 4, Apr. 2013, 3 pages.
Sun et al., "100 nm gate AlGaN/GaN HEMTs on Silicon with fT = 90 GHz", Electronic Letters, Mar. 26, 2009, vol. 45, No. 7, 2 pages.
Sun et al., "102-GHz AllnN/GaN on Silicon with 2.5-W/mm Output Power at 10 GHz", IEEE Electron Device Letters, vol. 30, No. 8, Aug. 2009, 3 pages.
Tirelli et al., "107-GHz (Al,Ga)N/GaN HEMTs on Silicon with Improved Maximum Oscillation Frequencies", IEEE Electron Device Letters, vol. 31, No. 4, Apr. 2010, 3 pages.

(56) References Cited

OTHER PUBLICATIONS

Tsou et al., "101-GHz InAlN/GaN HEMTs on Silicon with High Johnson's Figure-of-Merit", IEEE Electron Device Letters, vol. 62, No. 8, Aug. 2015, 4 pages.
Wang et al., "Enhancement-Mode InAlN/AlN/GaN HEMTs with 10-12 A/mm Leakage Current and 1012 On/Off Current Ratio", IEEE Electron Device Letters, vol. 32, No. 3, Mar. 2011, 3 pages.
Xie, H., "CMOS-compatible GaN-on-Si-HEMTs with cut-off frequency of 210 GHz and High Johnson's figure-of-merit of 8.8 THz V", Applied Physics Express, 2020, 13, 5 pages.
Xie, H., "Deeply-scaled GaN-on-Si high electron mobility transistors with record cut-off frequency fT of 310 GHz", Applied Physics Express, 2019, 12, 6 pages.
Xing et al., "InAlN/GaN HEMTs on Si with High fT of 250 GHz", IEEE Electron Device Letters, vol. 39, No. 1, Jan. 2018, 4 pages.
Yang et al., "High-Quality Interface in Al2O3/GaN/AlGaN/GaN MIS Structures with In Situ Pre-Gate Plasma Nitridation", IEEE Electron Device Letters, vol. 34, No. 12, Dec. 2013, 3 pages.
Ye et al., "GaN metal-oxide=semiconductor high-electron-mobility-transistor with atomic layer deposited Al2O3 as gate dielectric", Appl. Phys. Lett., 86, 063501, 2005, 4 pages.
Yu et al., "Schottky barrier engineering in 111-V nitrides via the piezoelectric effect", Appl. Phys. Lett., 73, 1880, 1998, 4 pages.
Yue, Y., "Ultrascaled InAlN/GaN High Electron Mobility Transistors with Cutoff Frequency of 400 GHz", Jpn. Journal of Applied Physics, 52, 2013, 3 pages.
Zhang et al., "Revealing the Nitridation Effects on GaN Surface by First-Principles Calculations and X-Ray/ultraviolet Photoemission Spectroscopy", IEEE Transactions on Electronic Devices, vol. 64, No. 10, Oct. 2017, 8 pages.
Zhao et al., "Interface charge engineering in down-scaled AlGaN (<6nm)/GaN heterostructure for fabrication of GaN-based power HEMTs and MIS-HEMTs", Appl. Phys. Lett., 116, 103502, 2020, 6 pages.

* cited by examiner

RF performance

SEMICONDUCTOR DEVICE AND FABRICATION METHODS THEREOF

CROSS REFERENCE TO RELATED APPLICATIONS

This application claims priority from U.S. Provisional Application Ser. No. 63/208,529, titled "A Two-Step Annealing on InAlN/GaN Source/Drain Contacts," filed Jun. 9, 2021, incorporated herein by reference in its entirety.

STATEMENT REGARDING FEDERALLY SPONSORED RESEARCH

This invention was made with government support under Grant 80NSSC20M0142 awarded by the NASA International Space Station and Grants FA9550-19-1-0297 and FA9550-21-1-0076 awarded by the Air Force Office of Scientific Research. The government has certain rights in the invention.

FIELD OF THE INVENTION

The present invention relates generally to a semiconductor device and fabrication methods thereof. More particularly, the present invention relates to methods for fabricating an indium aluminum nitride/gallium nitride high electron mobility transistor (InAlN/GaN HEMT) on a silicon (Si) substrate by a two-step annealing process.

BACKGROUND OF THE INVENTION

High electron mobility transistor (HEMT) semiconductor devices are basic building blocks for broad high-power and high-frequency applications, including but not limited to, millimeter wave power amplifiers. Conventionally, the HEMT device comprises: a group III-V substrate; a source electrode, a drain electrode and a metal T-gate deposited between the first source electrode and the drain electrode. Typical HEMT devices include GaAs-based HEMT, InP-based HEMT, and GaN-based HEMT devices.

In particular, InAlN/GaN HEMT on silicon carbide (SiC) substrates are known in the art. A Si substrate has a lower cost and improved scaling capability compared to the SiC substrate, but the larger lattice mismatch between Si and GaN hinders the epitaxial material quality and radio frequency (RF) performance of the HEMT device.

In improving performance of InAlN/GaN HEMT devices on Si, the low quality surface native oxide ($GaO_x$) presents a challenge, particularly for material electron mobility and device performance. An in-situ remote plasma pretreatment (RPP) carried out in an atomic layer deposition (ALD) system has demonstrated some capability of removing the surface native oxide, but the surface damage due to the plasma treatment is undesirable.

Thus, semiconductor devices and fabrication methods thereof are desired for improving GaN-on-Si HEMT technology, particularly as compared to GaN-on-SiC HEMT counterparts.

SUMMARY OF THE INVENTION

Aspects of the present invention are directed to semiconductor devices and fabrication methods thereof, and more particularly, to methods for fabricating an InAlN/GaN HEMT device on a Si substrate by a two-step annealing process.

In accordance with one aspect of the present invention, a method of fabricating a semiconductor device is disclosed. The method comprises the steps of (a) depositing an epitaxial layer over a substrate to form a semiconductor layer surface; (b) subjecting the semiconductor layer surface to an etching process to form at least one mesa portion; (c) depositing a metal stack on the semiconductor layer surface; (d) subjecting the semiconductor layer surface to a rapid thermal annealing (RTA) system for ohmic contact annealing in $H_2/N_2$ forming gas (hereinafter abbreviated as "FG"); and (e) subjecting the semiconductor layer surface to the RTA system for ohmic contact annealing in nitrogen ($N_2$). Additionally or optionally, the method comprises (f) subjecting the semiconductor layer surface to an oxygen plasma treatment; and (g) depositing a T-shaped gate on the semiconductor layer surface.

In accordance with another aspect of the present invention, a semiconductor device is disclosed. The semiconductor device comprises a semiconductor layer surface. The semiconductor layer surface includes an epitaxial layer over a substrate comprising silicon; at least one mesa portion formed on the semiconductor layer surface; a metal stack on the semiconductor layer surface; and a T-shaped metal gate on the semiconductor layer surface. The semiconductor layer surface having the metal stack is sequentially annealed in FG and $N_2$, each for a predetermined duration.

In accordance with yet another aspect of the present invention, a method of subjecting a semiconductor layer surface to post-metallization annealing is disclosed. The method comprises the steps of (a) subjecting the semiconductor layer surface to a first anneal phase, the first anneal phase comprising subjecting the semiconductor layer surface to an RTA system for ohmic contact annealing in FG; and (b) subjecting the semiconductor layer surface to a second anneal phase, the second anneal phase comprising subjecting the semiconductor layer surface to the RTA system for ohmic contact annealing in $N_2$. Additionally or optionally, method comprises the steps of (c) subjecting the semiconductor layer surface to a pre-anneal phase, the pre-anneal phase comprising heating to a first temperature for a first predetermined duration; and (d) subjecting the semiconductor layer surface to a post-anneal phase, the post-anneal phase comprising heating to a second temperature. In an exemplary embodiment, step (b) occurs after step (a).

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale unless otherwise indicated. On the contrary, the dimensions of the various features may be expanded or reduced for clarity. Included in the drawings are the following figures.

DETAILED DESCRIPTION OF THE INVENTION

Aspects of the invention are described herein with reference to InAlN/GaN HEMT devices on a Si substrate. It will be understood by one of ordinary skill in the art that the exemplary methods described herein are not limited for use with InAlN/GaN HEMT devices on a Si substrate, but may be applicable to other known GaN-on-Si HEMT devices.

Figure 1:
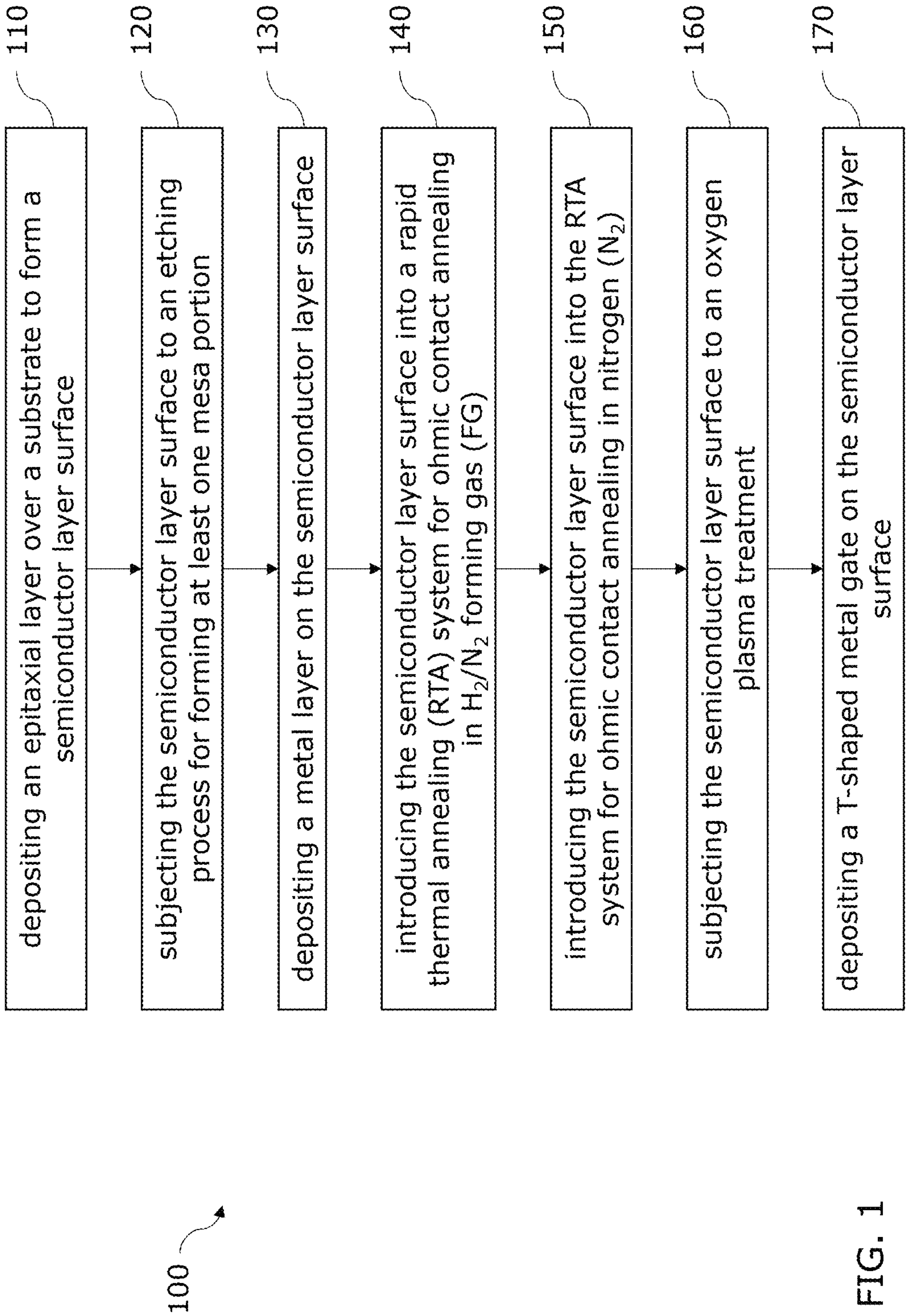
FIG. 1 depicts an exemplary method of fabricating a semiconductor device in accordance with an embodiment of the invention.

Referring now to FIG. 1, an exemplary method of fabricating a semiconductor device, such as an InAlN/GaN HEMT device on a Si substrate, in accordance with an embodiment of the invention, is depicted. Details of method 100 are set forth below with respect to the elements of semiconductor device 200 (FIGS. 2A-2B), which is discussed further below. Generally, the method, such as method 100, includes one or more steps including depositing a metal stack on the semiconductor layer surface having an epitaxial layer over a substrate; subjecting the semiconductor layer surface to an RTA system for ohmic contact annealing in FG; and subjecting the semiconductor layer surface to the RTA system for ohmic contact annealing in $N_2$. Additionally, or optionally, no passivation process is applied to device 200.

In step 110, an epitaxial layer is deposited over a substrate to form a semiconductor layer surface. In an example, as best illustrated in FIGS. 2 and 3A-3D, epitaxial layer 226 is deposited over substrate 202 to form semiconductor layer surface 222. In an exemplary embodiment, substrate 202 comprises Si. Additionally, or optionally, epitaxial layer 226 is deposited over substrate 202 using chemical vapor deposition, such as metal organic chemical vapor deposition (MOCVD). One skilled in the art would understand from the description herein that other deposition, lithography, or thermal growth techniques may be used to form semiconductor layer surface 222.

Epitaxial layer 226 may comprise multiple layers. In an exemplary embodiment, the multiple layers may include, but are not limited to, a buffer layer and a back barrier layer. The buffer layer, such as buffer layer 204 may comprise a Group III-V semiconductor substrate. In an exemplary embodiment, buffer layer 204 comprises gallium nitride (GaN). A back barrier layer 208 is formed on the buffer layer 204. The back barrier layer 208 may comprise $In_yGa_{1-y}N$ where y is between 0.05 and 0.2. As used herein, the term "between" when referring to a range shall be interpreted to include at least the endpoints (e.g. "between 0.05-0.2" shall be interpreted to mean "in a range of 0.05-0.2"). In an exemplary embodiment, the back barrier layer comprises $In_{0.12}Ga_{0.88}N$.

Additionally or optionally, epitaxial layer 226 includes a channel layer, such as channel layer 210 formed on the back barrier layer 208. The channel layer 210 may also comprise GaN. An interlayer 212 may be formed on the channel layer 210. In an exemplary embodiment, the interlayer 212 comprises aluminum nitride (AlN). A lattice-matched barrier layer 214 is formed on the interlayer 212. The lattice-matched barrier layer 214 comprises $In_xAl_{1-x}N$ where x is between 0 and 0.3. In an exemplary embodiment, the lattice-matched barrier layer 214 comprises $In_{0.17}Al_{0.83}N$. Finally, epitaxial layer 226 comprises a cap layer, such as cap layer 216 formed on the lattice-matched barrier layer 214. In an exemplary embodiment, the cap layer 216 also includes GaN.

Figures 3A, 3B, 3C, 3D:
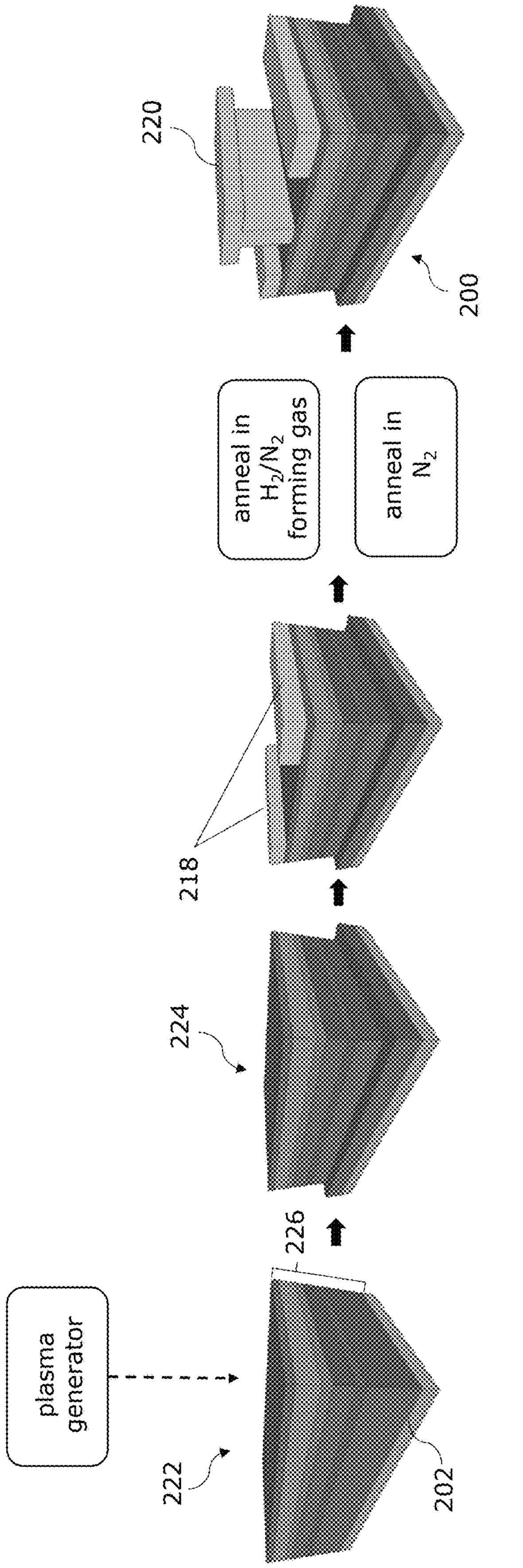
FIGS. 3A-3D is a schematic depicting steps of the method of FIG. 1.

In step 120, the semiconductor layer surface is subjected to an etching process for forming at least one mesa portion. In an example, as shown in FIGS. 3A-3B, semiconductor layer surface 222 is subjected to the etching process for forming at least one mesa portion 224. In an exemplary embodiment, the at least one mesa portion 224 is formed by an etching treatment in which a portion of the epitaxial layer 226 is removed. In a non-limiting example, the at least one mesa portion 224 is formed by removing material from a portion of the buffer layer 204 of the epitaxial layer 226, such that a ledge 206 of the buffer layer 204 is formed. In an exemplary embodiment, the etching process comprises gas plasma etching, as performed by a plasma treatment apparatus configured for ion bombardment to remove material from the semiconductor layer surface 222. In a non-limiting example, the plasma treatment apparatus comprises an inductively coupled plasma (ICP) generator, such as a chlorine ($Cl_2$)-based ICP generator. One skilled in the art would know from the description herein that other plasma treatment apparatuses may be used, including but not limited to Capacitively Coupled Plasma (CCP), Reactive Ion Etching Plasma (RIE), Magnetically Enhanced Reactive Ion Etch Plasma (MERIE), direct plasma, remote plasma, and Electron Cyclotron Resonance (ECR) plasma generators.

Figure 2A:
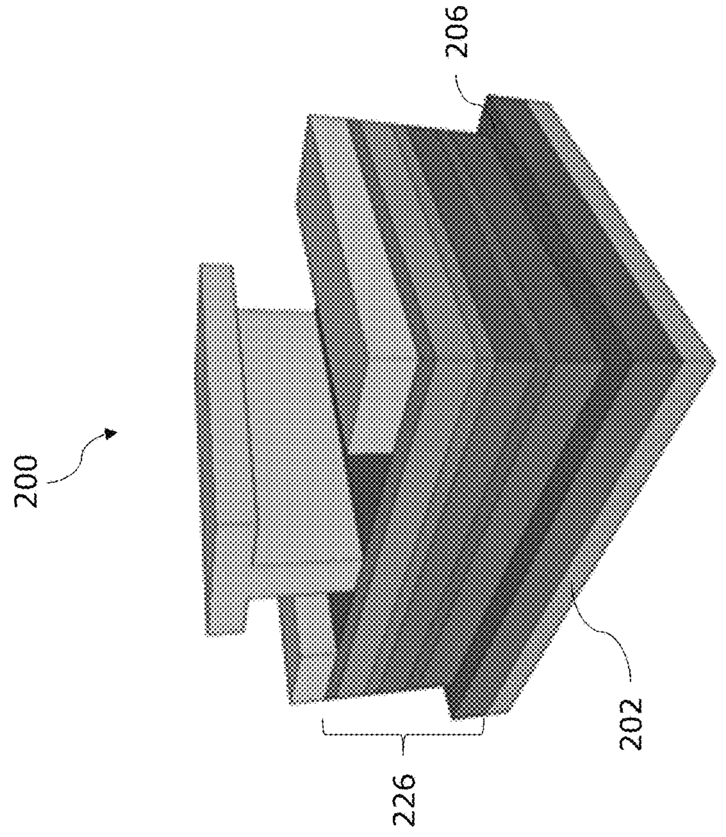
FIGS. 2A-2B depict an exemplary semiconductor device fabricated in accordance with at least the method of FIG. 1, showing an exemplary semiconductor layer surface.
Figure 2B:
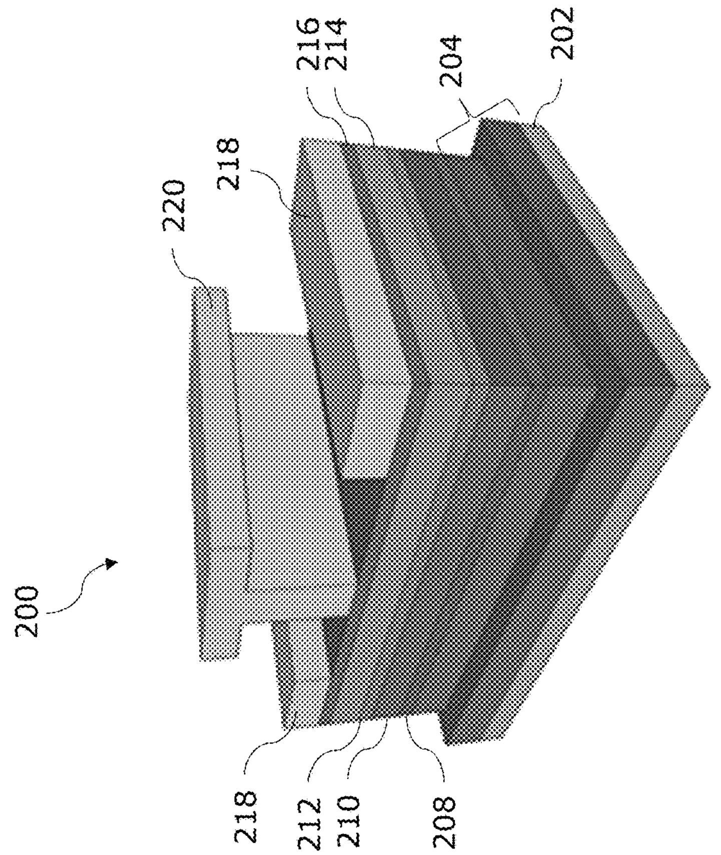

In step 130, metallization occurs by depositing a metal stack on the semiconductor layer surface. In an example, as best illustrated in FIGS. 2A-2B and 3C, metal stack 218 is deposited on the semiconductor layer surface 222 to form alloyed ohmic contacts. In an exemplary embodiment, metal stack 218 is planarly deposited on cap layer 216 of the semiconductor layer surface 222. Metal stack 218 may comprise titanium (Ti), Al, or a combination thereof. In particular, metal stack 218 comprises Ti, Al, nickel (Ni), gold (Au), or a combination of any two or more thereof.

In step 140, the semiconductor layer surface is subjected to a rapid thermal annealing (RTA) system for ohmic contact annealing in FG. In an exemplary embodiment, as shown in FIGS. 3A-3D, the semiconductor layer surface 222 is annealed between 700° C. and 900° C. in FG for between 10 and 50 seconds. In an example, the semiconductor layer surface 222 is annealed at 800° C. for 20 seconds in $N_2$ or 850° C. in FG for 40 seconds. In embodiments, the FG may comprise 5% $H_2$ and 95% $N_2$. One skilled in the art would understand that semiconductor layer surface 222 may be subjected to additional or alternative rapid thermal processing (RTP) systems or features thereof, e.g., heating configurations, energy sources, or temperature control methods, without departing from the spirit and scope of the invention.

In step 150, the semiconductor layer surface is introduced into the RTA system for ohmic contact annealing in $N_2$. In an exemplary embodiment, as shown in FIGS. 3A-3D, semiconductor layer surface 222 is annealed between 750° C. and 950° C. in $N_2$ and/or for between 10 and 50 seconds. In an example, the semiconductor layer surface 222 is annealed at 850° C. in FG and for 20 or 40 seconds. Still further, in an exemplary embodiment, step 150 occurs after step 140.

In step 160, the semiconductor layer surface is subjected to an oxygen plasma treatment. In an example, the semiconductor layer surface 222 is subjected to an oxygen plasma treatment, such as for example, for preparing the semiconductor layer surface 222 for step 170. In an exemplary embodiment, step 160 of method 100 may comprise subjecting semiconductor layer surface 222 to a plasma asher, such as the Branson IPC3000 $O_2$ Asher, as described and manufactured by Allwin21 Corp. of Morgan Hill, CA. In an exemplary embodiment, the plasma asher is operated at 800 W for 1 min.

In step 170, a T-shaped metal gate is formed on the semiconductor layer surface. 17. In an exemplary embodiment, as shown in FIGS. 2 and 3A-3D, the T-shaped metal gate 220 is formed on the semiconductor layer surface 222. In an example, the T-shaped metal gate 220 is formed on cap layer 216. Further, the T-shaped metal gate 220 may be formed on the semiconductor layer surface 222 via electron beam lithography (EBL). One skilled in the art would understand from the description herein that various nanofabrication processes and lithography techniques, including but not limited to, optical lithography, interference lithography, X-ray lithography, and nanoimprint lithography may be used to form T-shaped metal gate 220.

In an exemplary embodiment, the T-shaped metal gate comprises Ni, Au, or a combination thereof. Still further, one skilled in the art would understand from the description herein that the term "T-shaped" may refer generally to a geometry that may be symmetrical or asymmetrical, or more particularly, a geometry with as narrow a foot-width as possible and as broad a head-width as possible for achieving high frequency performance of HEMTs.

FIG. 1 depicts an exemplary method comprising steps that are performed sequentially in the order recited. However, it should be understood from the description herein that one or more steps may be omitted and/or performed out of the described sequence of the process while still achieving the desired result. Further, additional fabrication steps of semiconductor device 200 described herein (e.g., with respect to the two-step annealing process) may be included within the steps of method 100.

Figure 4:
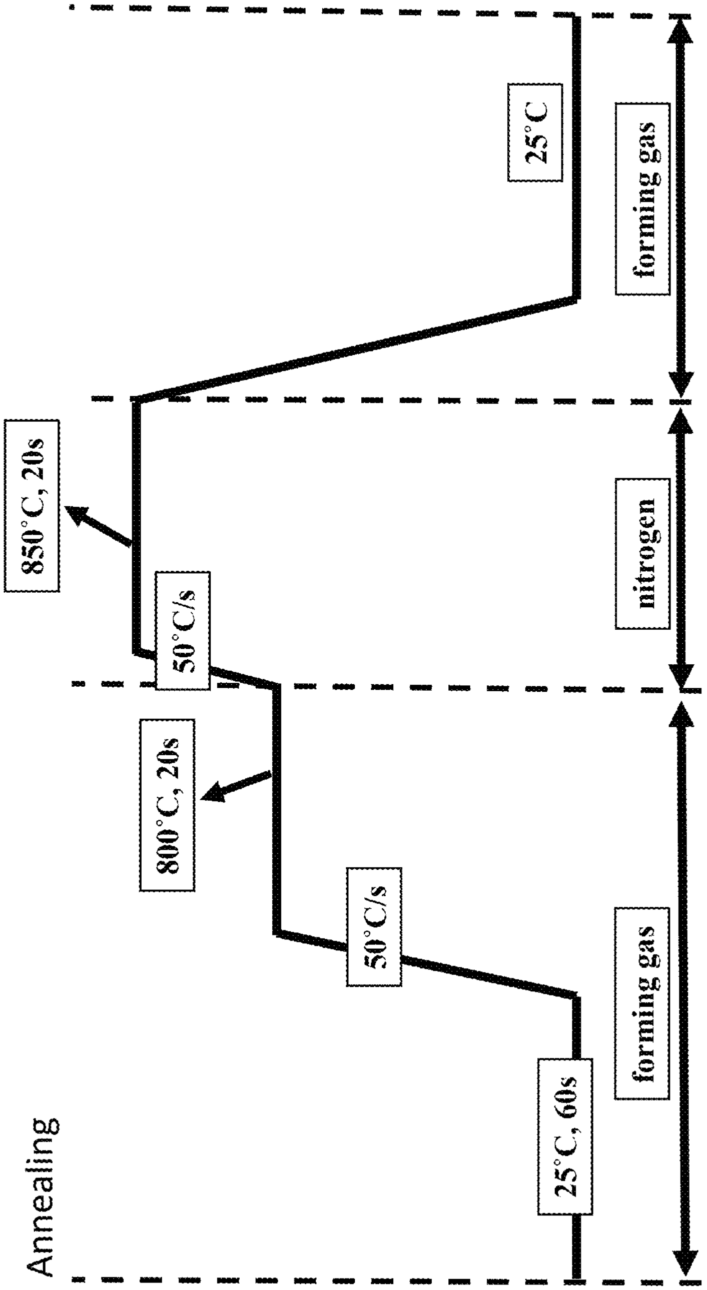
FIG. 4 depicts exemplary parameters of an exemplary annealing step of the method of FIG. 1.

Referring now to FIGS. 4 and 15, a method of subjecting a semiconductor layer surface to post-metallization annealing is disclosed. Generally, the method, such as method 300, includes one or more steps subjecting the semiconductor layer surface to a first anneal phase and a second anneal phase. Additionally or optionally, method 300 comprises a pre-anneal phase and a post-anneal phase. Details of method 300 are set forth below with respect to the elements of semiconductor device 200 (FIGS. 2A-2B), which is discussed further below.

In step 310, the semiconductor layer surface is subjected to a pre-anneal phase. The pre-anneal phase may generally be configured to reduce thermal shock from the subsequent annealing steps and/or for improving thermal stability. In an exemplary embodiment, the semiconductor layer surface 222 is subjected to a pre-anneal phase. The pre-anneal phase includes heating semiconductor layer surface 222 to a first temperature for a first predetermined duration. In an example, the first temperature is between 15° C. and 35° C. and the first predetermined duration is between 30 to 90 seconds. In an exemplary embodiment, the semiconductor layer surface 222 is heated at 25° C. for 60 seconds during the pre-anneal phase. Additionally or optionally, the semiconductor layer surface 222 is heated at 25° C. in FG.

In step 320, the semiconductor layer surface is subjected to a first anneal phase. In an exemplary embodiment, the semiconductor layer surface 222 is subjected to a first anneal phase. The first anneal phase comprises introducing the semiconductor layer surface 222 into the RTA system for ohmic contact annealing in FG. The RTA system may include a ramping rate of 50° C./s. In an exemplary embodiment, semiconductor layer surface 222 is annealed between 700° C. and 900° C. in FG and for between 10 and 50 seconds. More specifically, semiconductor layer surface 222 is annealed at 800° C. for 20 seconds or 850° C. in FG for 40 seconds during the first anneal phase.

In step 330, the semiconductor layer surface is subjected to a second anneal phase. In an exemplary embodiment, the semiconductor layer surface 222 is subjected to a second anneal phase. The second anneal phase comprises introducing the semiconductor layer surface 222 into the RTA system for ohmic contact annealing in $N_2$. The RTA system may include a ramping rate of 50° C./s. In an exemplary embodiment, semiconductor layer surface 222 is annealed between 750° C. and 950° C. in $N_2$ and for between 10 and 50 seconds. More specifically, semiconductor layer surface 222 is annealed at 850° C. in $N_2$ for 20 or 40 seconds during the second anneal phase.

In an exemplary embodiment, step 330 occurs after step 320. As will be explained in the example below, FG annealing in step 320 can effectively remove native oxide from the semiconductor layer surface 222 for improving surface properties of the HEMT device. Thus, the FG annealing step 320 leads to increased 2DEG electron density, thereby leading to a decrease in Ohmic sheet resistance ($R_{sheet}$). So, in an exemplary embodiment, to offset the increased Ohmic contact resistance ($R_C$) from FG annealing in step 320, a sequential $N_2$ annealing step 330 is applied.

In step 340, the semiconductor layer surface is subjected to a post-anneal phase. In an exemplary embodiment, the semiconductor layer surface 222 is subjected to a post-anneal phase. The post-anneal phase comprises heating to a second temperature. In an exemplary embodiment, the second temperature is between 15° C. and 35° C., and more preferably, at 25° C., during the post-anneal phase. Additionally, or optionally, the semiconductor layer surface 222 is heated at 25° C. in FG.

Figure 14:
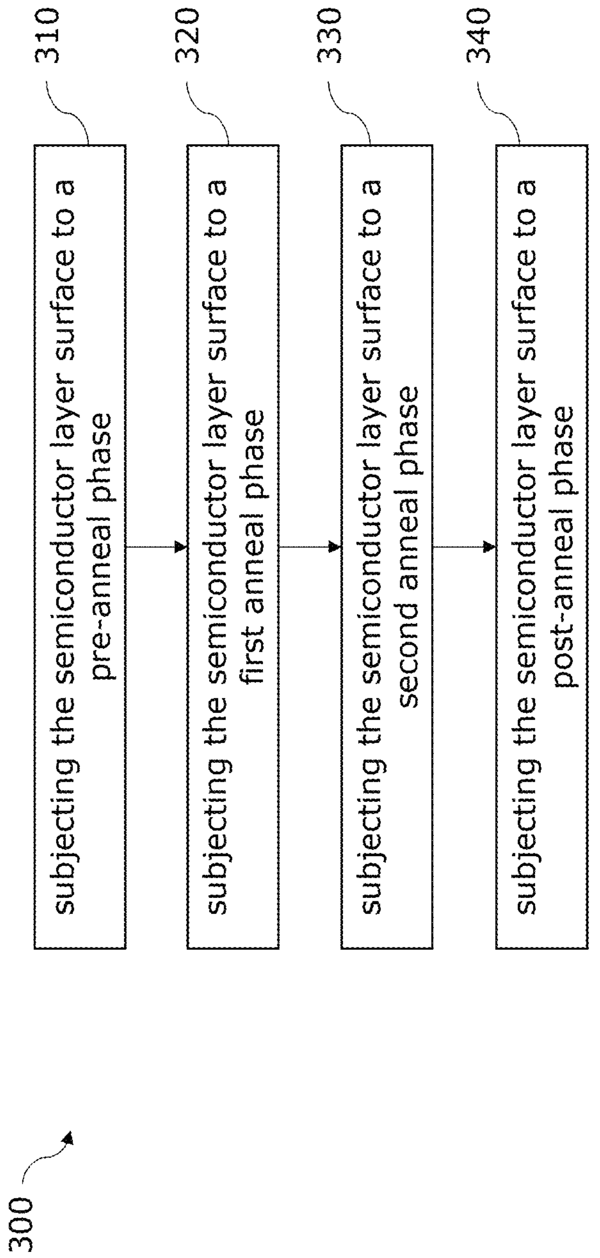
FIG. 14 depicts an exemplary method of subjecting a semiconductor layer surface to post-metallization annealing in accordance with an embodiment of the invention.

FIG. 14 depicts an exemplary method comprising steps that are performed sequentially in the order recited. However, it should be understood from the description herein that one or more steps may be omitted and/or performed out of the described sequence of the process while still achieving the desired result. Further, additional fabrication steps of semiconductor device 200 described herein (e.g., with respect to metallization in method 100) may be included within the steps of method 300.

Referring now to FIGS. 2A-2B and 3A-3D, an exemplary semiconductor device fabricated in accordance with one or more of the methods of FIGS. 1 and 15 is disclosed. Generally, semiconductor device 200 comprises the semiconductor layer surface 222, the at least one mesa portion 224 formed on semiconductor layer surface 222; the metal stack 218 on the semiconductor layer surface 222; and the T-shaped metal gate 220 on the semiconductor layer surface 222. Additional details of semiconductor device 200 are discussed further below.

Semiconductor layer surface 222 comprises the epitaxial layer 226 disposed over substrate 202. In an exemplary embodiment, substrate 202 comprises silicon and has a thickness between 2 and 6 inches. Epitaxial layer 226 may comprise multiple layers. The multiple layers include, but are not limited to, a buffer layer, such as buffer layer 204 comprising a Group III-V semiconductor substrate. In an example, buffer layer 204 comprises gallium nitride (GaN) and may have a thickness of between 1 μm and 3 μm. In an exemplary embodiment, buffer layer comprises a 2-μm undoped GaN buffer layer. Epitaxial layer 226 includes a back barrier layer 208 formed on the buffer layer 204. The back barrier layer 208 may comprise $In_yGa_{1-y}N$. In an example, back barrier layer 208 comprises $In_yGa_{1-y}N$ where y is between 0.05 and 0.2. Back barrier layer 208 may have a thickness of between 1 nm and 7 nm. In an exemplary embodiment, back barrier layer 208 comprises a 4-nm $In_{0.12}Ga_{0.88}N$ back barrier layer.

Additionally or optionally, epitaxial layer 226 may include a channel layer, such as channel layer 210 formed on the back barrier layer 208. In an example, channel layer 210 may comprise GaN. Channel layer 210 may have a thickness of between 10 nm and 20 nm. In an exemplary embodiment, channel layer 210 comprises a 15-nm GaN channel layer. An interlayer 212 may be formed on the channel layer 210. In an example, the interlayer 212 comprises aluminum nitride (AlN) and has a thickness of between 0.1 nm and 2.1 nm. In an exemplary embodiment, interlayer 212 comprises a 1-nm AlN interlayer. A lattice-matched barrier layer 214 is formed on the interlayer 212. The lattice-matched barrier layer 214 comprises $In_xAl_{1-x}N$. In an example, lattice-matched barrier layer 214 comprises $In_xAl_{1-x}N$, where x is between 0 and 0.3. Lattice-matched barrier layer 214 has a thickness of between 5 nm and 11 nm. In an exemplary embodiment, the lattice-matched barrier layer 214 comprises 8-nm lattice-matched $In_{0.17}Al_{0.83}N$ barrier layer. Finally, epitaxial layer 226 comprises a cap layer, such as cap layer 216 formed on the lattice-matched barrier layer 214. In an example, the cap layer 216 also includes GaN and has a thickness of between 0 nm and 4 nm. In an exemplary embodiment, the cap layer 216 comprises a 2-nm GaN cap layer.

Further, the metal stack 218 is disposed on the semiconductor layer surface 222. As discussed above, semiconductor layer surface 222 with the metal stack 218 is sequentially annealed in FG and then in $N_2$, each for a predetermined duration. After the two-step annealing process, the T-shaped metal gate 220 on the semiconductor layer surface 222 is formed by EBL. In particular, semiconductor layer surface 222 is formed, such that device 200 may have one or more of the following characteristics: a source-drain spacing ($L_{sd}$) of between 0 and 2 μm, a gate-source spacing ($L_{gs}$) between 375 nm and 575 nm, and a gate footprint ($L_g$) between 30 nm to 70 nm. In an exemplary embodiment, source-drain spacing ($L_{sd}$) is 1 μm, gate-source spacing ($L_{gs}$) is 475 nm, and gate footprint ($L_a$) is 50 nm.

Still further, in an exemplary embodiment, semiconductor device 200 comprises a 50-nm gate length InAlN/GaN HEMT on Si substrate device having improved surface properties. The improved surface properties comprise improvements in at least channel electron density, leakage current, subthreshold swing (SS), noise, or combination thereof. In particular, the improved surface properties comprise one or more of an SS of between 90 and 140 mV/dec, a transconductance ($g_m$) peak of between 315 and 515 mS/mm, a low draw-induced barrier lowing (DIBL) of 50 and 80 mV/V, and high power gain cutoff frequency ($f_{max}$) of between 200 and 340 GHz. In an exemplary embodiment, improved surface properties comprise one or more of an SS of 110 mV/dec, a transconductance ($g_m$) peak of 415 mS/mm, a low draw-induced barrier lowing (DIBL) of 65 mV/V, and high power gain cutoff frequency ($f_{max}$) of 270 GHz.

As will be discussed in the example below, exemplary InAlN/GaN HEMT devices on Si, as prepared or fabricated by the methods described above, provide improved device performance. Sequential use FG and $N_2$ annealing steps for post-metallization annealing in InAlN/GaN HEMT devices on Si can avoid unintentional oxidation, decrease leakage current, and reduce the traps due to the hydrogen passivation. Notably, the FG annealing effectively removes surface native oxide prior to gate metal deposition.

Compared with only $N_2$ annealing, the native oxide is removed by FG annealing (such as in step 140 of method 100 and/or step 320 of method 300), thereby increasing the two-dimensional electron gas (2DEG) electron density as determined by one or more of X-ray photoelectron spectra (XPS), energy band simulation and capacitance-voltage measurement. Transmission line measurement (TLM) showed that $N_2$ annealing (such as in step 150 of method 100 and/or step 330 of method 300) offers a lower ohmic contact resistance ($R_C$) while FG annealing (such as in step 140 of method 100 and/or step 320 of method 300) features a lower sheet resistance ($R_{sheet}$). Thus, a method or process using FG/$N_2$ two-step annealing (such as method 100 and/or 300) can utilize both the advantages of FG annealing and $N_2$ annealing. Such advantages may be indicated by at least one of the following with respect to a 50-nm gate length InAlN/GaN HEMT: a subthreshold swing (SS) of 110 mV/dec, a transconductance ($g_m$) peak of 415 mS/mm, a record low drain-induced barrier lowing (DIBL) of 65 mV/V, and a record high power gain cutoff frequency ($f_{max}$) of 270 GHz.

Example

The co-inventors assessed the effect of FG and $N_2$ annealing on the material surface properties of InAlN/GaN HEMTs on Si substrate that is fabricated in accordance with methods 100 or 300, as discussed above. For purposes of the various tests detailed below, the experimental or sample InAlN/GaN HEMTs on Si substrate comprises an epitaxial layer that was grown by metal organic chemical vapor deposition (MOCVD) on a 4-inch Si substrate. The epitaxial layer includes a 2-nm GaN cap layer, an 8-nm lattice-matched $In_{0.17}Al_{0.83}N$ barrier layer, a 1-nm AlN interlayer, a 15-nm GaN channel layer, a 4-nm $In_{0.12}Ga_{0.88}N$ back barrier layer, and a 2-μm undoped GaN buffer layer.

The method of fabricating the semiconductor device starts with mesa isolation using Cl2-based inductively coupled plasma etching process. A Ti/Al/Ni/Au metal stack is deposited and annealed to form alloyed ohmic contacts. A two-step annealing is used for the InAlN/GaN HEMTs. In particular, as shown in FIGS. 4 and 15, the semiconductor device is annealed at 850° C. first in FG for 20 s and then at 850° C. in $N_2$ for 20 s. The ohmic contact rapid thermal annealing (RTA) process is carried out using Solaris 150 Rapid Thermal Processing System with a ramping rate of 50° C./s. The system temperature accuracy and stability are both ±2.5° C. and the temperature variation across the entire chamber is ±2.5° C. Following oxygen plasma treatment, a Ni/Au T-shaped metal gate with a gate width ($W_g$) of 2×20 μm is fabricated by electron beam lithography. The devices present a source-drain spacing ($L_{sd}$) of 1 μm, a gate-source spacing ($L_{gs}$) of 475 nm, and a gate footprint ($L_g$) of 50 nm, respectively. No passivation process is applied on the reported devices. The current-voltage (I-V) and capacitance-voltage (C-V) measurements are taken by using an Agilent B1500A semiconductor parameter analyzer. The resulting semiconductor device (e.g. InAlN/GaN HEMTs on Si substrate) was subjected to various testing as detailed below.

X-Ray Photoelectron Spectra (XPS) Measurement

Figure 5:
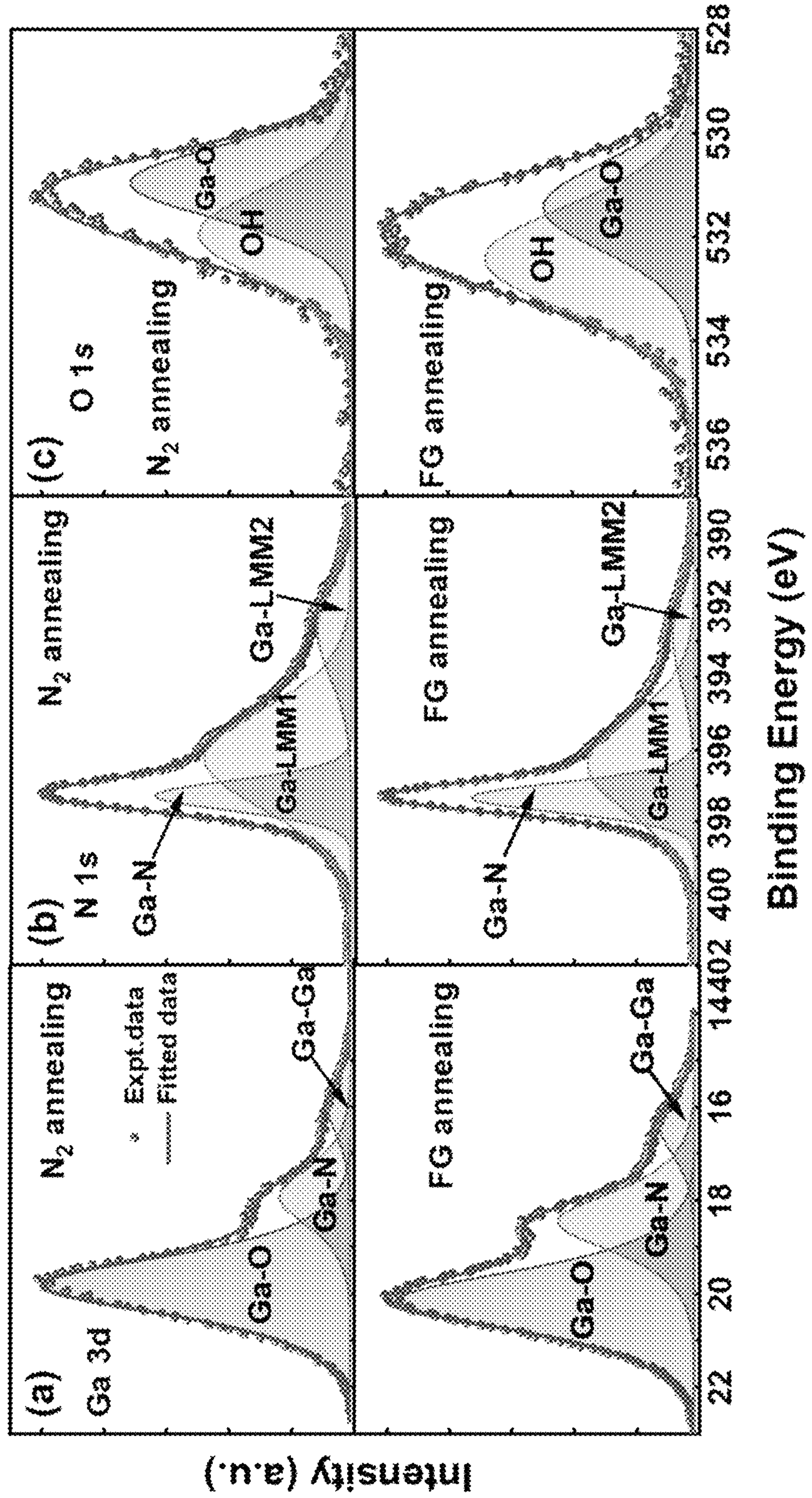
FIG. 5 depicts an X-ray photoelectron spectra (XPS) of exemplary layers taken from the semiconductor layer surface of FIGS. 2A-2B after the annealing steps of FIG. 1.

To study the effect of FG and $N_2$ annealing on the material surface properties, the co-inventors conducted XPS of exemplary layers of InAlN/GaN HEMT devices on Si substrate prepared in accordance with embodiments of the invention. Two annealing conditions were adopted: 850° C. for 40 s in $N_2$; and 850° C. for 40 s in forming gas (FG: 5% $H_2$ and 95% $N_2$). FIG. 5 shows the XPS of (a) Ga 3d core-level, (b) N 1s core-level, and (c) O 1s core-level taken from InAlN/GaN heterostructure with 2-nm GaN cap layer after $N_2$ annealing (top) and FG annealing (bottom), respectively. Relative percentage of fitting components is calculated from the ratio of the area under individual peak and total peak area of all components, as shown in TABLE 1 below, which summarizes fitting parameters for the Ga 3d core-level spectra, N 1s core level spectra, and O 1s (in FIG. 5) for samples after $N_2$ and FG annealing, respectively. Relative percentage of fitting components is calculated from the ratio of the area under individual peak and total peak area of all components.

induced by PEALD alternate insertion of AlN in Al 2 O 3," RSC advances, vol. 7, pp. 11745-11751, 2017, doi:10.1039/C6RA27190A. With $N_2$ annealing, the relative percentage of Ga—O and Ga—N bonds are 76% and 18%, which results in the ratio between Ga—O and Ga—N of 4.2. With FG annealing, the relative percentage of Ga—O and Ga—N bonds are 63% and 29%, resulting in the ratio between Ga—O and Ga—N of 2.2. The decrease of the Ga—O to Ga—N ratio (4.2 vs. 2.2) shows that the native oxide is more effectively reduced after FG annealing.

In graph (b) of FIG. 5, the N 1s core level spectra with three fitted peaks is shown. The fitting peaks at 397.24±0.02, 396.29±0.07, and 392.69±0.07 eV for Ga—N bond and two components for Ga LMM Auger features (Ga-LMM1 and GaN-LMM2, respectively). See T. Duan, et. al., "Interfacial chemistry and valence band offset between GaN and Al2O3 studied by X-ray photoelectron spectroscopy," Applied Physics Letters, vol. 102, p. 201604, 2013, doi:https://doi.org/10.1063/1.4807736 and S. Kushvaha, et. al., "Structural, optical and electronic properties of homoepitaxial GaN nanowalls grown on GaN template by laser molecular beam epitaxy," RSC Advances, vol. 5, pp. 87818-87830, 2015, doi:10.1039/C5RA11361J. The relative percentage of Ga—N for samples with $N_2$ annealing and FG annealing is 25% and 35%, respectively. Because the number of Ga atoms is fixed, the Ga—N bonds increasing means the Ga—O bonds are decreasing. This is another indication that native oxide is more effectively reduced with FG annealing.

In graph (c) of FIG. 5, the O 1s spectra have been fitted using two components (Ga—O bonds with fitting peak at 531.14±0.23 eV and OH bonds with fitting peak at 532.14±0.23 eV). See Y.-J. Lin et. al., "Investigation of surface treatments for nonalloyed ohmic contact formation in Ti/AI contacts to n-type GaN," Applied Physics Letters, vol. 77, pp. 3986-3988, 2000, doi:https://doi.org/10.1063/1.1332827 and P. Song, et. al., "Self-consistent growth of single-crystalline (201) β-Ga 2 O 3 nanowires using a flexible GaN seed nanocrystal," CrystEngComm, vol. 19, pp. 625-631, 2017, doi:10.1039/C6CE02319C. The relative percentages of Ga—O bonds are 55% ($N_2$ annealing) and 37% (FG annealing), which is another indication of the decreased Ga—O bonds with FG annealing. Therefore, the removal of native oxide using FG annealing is confirmed as being relatively more effective from these XPS measurement results.

Figure 6A:
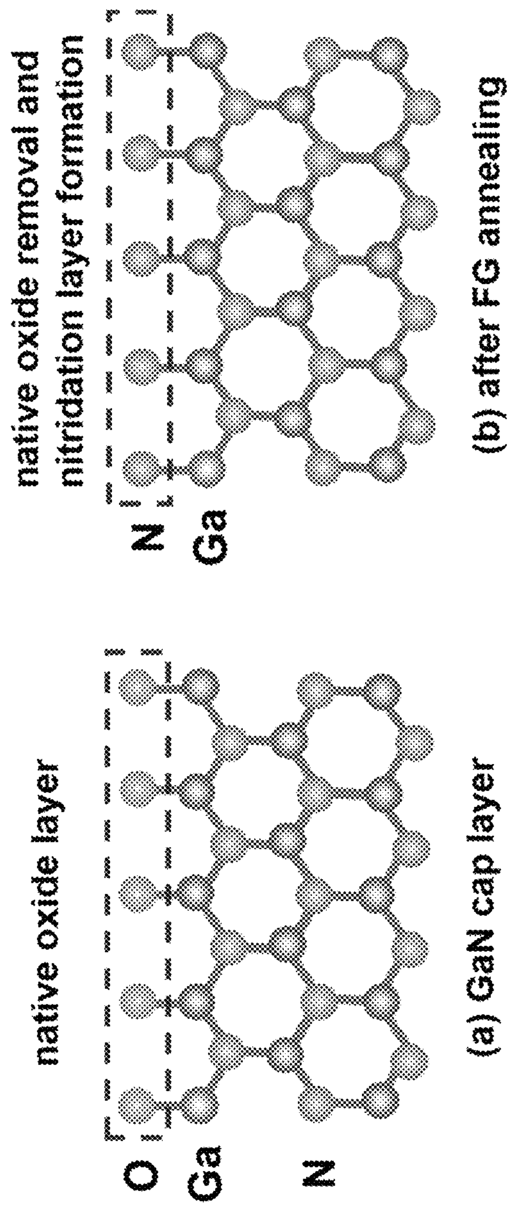
FIGS. 6A-6B are schematics depicting certain layers taken from the semiconductor layer surface of FIGS. 2A-2B, before and after the annealing steps of FIG. 1.

A schematic of the FG annealing effect is shown in FIG. 6A. As illustrated in schematic (a) of FIG. 6A, because the

TABLE 1

| | | Ga 3 d | | | N 1 s | | | O 1 s | |
|---|---|---|---|---|---|---|---|---|---|
| Sample | parameter | Ga—O | Ga—N | Ga—Ga | Ga—N | Ga-LMM1 | Ga-LMM2 | OH | Ga—O |
| $N_2$ annealing | Relative (%) | 76 | 18 | 6 | 25 | 61 | 14 | 45 | 55 |
| | Peak (eV) | 19.81 | 17.91 | 16.01 | 397.21 | 396.21 | 392.61 | 531.91 | 530.91 |
| FG annealing | Relative (%) | 63 | 29 | 8 | 35 | 53 | 12 | 63 | 37 |
| | Peak (eV) | 20.11 | 18.46 | 16.41 | 397.26 | 396.36 | 392.76 | 532.36 | 531.36 |

In graph (a) of FIG. 5, the Ga 3d spectra is resolved into three peaks. The fitting peaks at 19.96±0.15, 18.19±0.27, and 16.21±0.20 eV binding energies are corresponding to Ga—O, Ga—N, and Ga—Ga bonds, respectively. See S. Yang, et. al., cited above; Mishra, S. K. T C, et. al., "Pit assisted oxygen chemisorption on GaN surfaces," Physical Chemistry Chemical Physics, vol. 17, pp. 15201-15208, 2015, doi:10.1039/C5CP00540J; and Q. Wang, et. al., "Interface engineering of an AlNO/AlGaN/GaN MIS diode semiconductor material is exposed to the air, a native oxide layer ($GaO_x$) is formed on the surface of GaN cap layer. See S. Yang, et. al, and C. Hinkle, et. al., cited above. A difference between $N_2$ annealing and FG annealing is the existence of $H_2$ in the ambient. During the high temperature (850° C.) annealing process, the H atoms in $H_2$ can combine with the O atom in the native oxide. The O atoms are extracted by the H atoms and thus the O vacancies are formed on the surface. $N_2$ in the FG can offer nitrogen atoms to fill the O vacancies. After removing native oxide, a new nitridation layer is formed on the surface, as illustrated in schematic (b) of FIG. 6A. Hence, with FG annealing, the number of Ga—O bonds decreases while Ga—N bonds increases.

The results of the XPS measurements described above suggests that decreased Ga—O bonds are achieved with FG annealing, as indicated by the relative percentages of Ga—O bonds at 55% ($N_2$ annealing) and 37% (FG annealing). The removal of native oxide using FG annealing is confirmed by the XPS measurement results, thereby meeting the objective of developing effective ways to remove surface native oxide prior to gate metal deposition. The removal of native oxide using FG annealing increases the 2DEG electron density, such as for example, as compared to $N_2$ annealing.

Electron Density Simulation

Figure 7A:
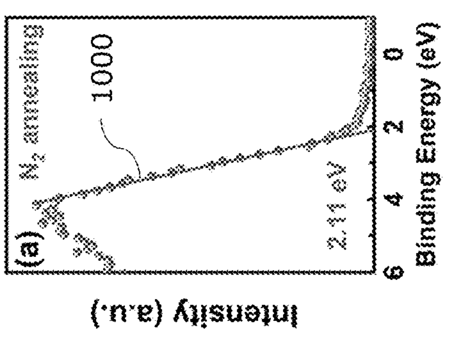
FIGS. 7A-7D are graphs depicting the valence band edge spectra taken from the semiconductor device of FIGS. 2A-2B after the annealing steps of FIG. 1.
Figure 7B:
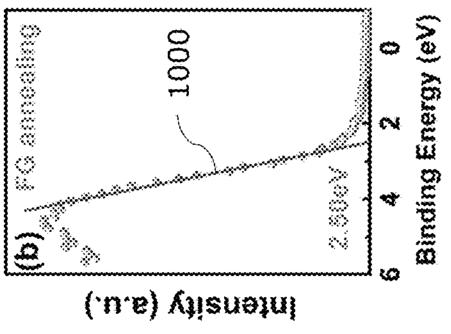

FIGS. 7A and 7B show the valence band edge spectra taken from prepared samples of exemplary InAlN/GaN HEMTs on Si substrate prepared in accordance with embodiments of the invention. The valence band edge spectra shown in FIG. 7A was taken after $N_2$ annealing and the valence band edge spectra shown in FIG. 7B was taken after FG annealing. The position of valence band maximum (VBM) is determined from the extrapolation of the solid lines 1000 in FIGS. 7A and 7B.

It turns out that VBM energy ($E_v$) lies at 2.11 ($N_2$ annealing) and 2.50 eV (FG annealing) below surface Fermi energy level ($E_f$). That means that the values of ($E_f$-$E_v$) are 2.11 ($N_2$ annealing) and 2.50 eV (FG annealing). Hence, the VBM positions can be obtained, confirming that $E_f$ at the material surface is lifted up with FG annealing. The lifted $E_f$ of GaN surface is believed to come from the removal of native oxide and the new nitridation layer formation.

In GaN/InAlN/GaN heterostructure, the surface donor state is treated as the source of the two-dimensional electron gas (2DEG) electrons. The lifted $E_f$ on the surface means more surface electrons, which can be transferred to the 2DEG channel via the barrier electrical field, leading to the increased 2DEG electron density.

The increased 2DEG electron density is beneficial for the improvement of the drain current and power density in GaN HEMTs, such as the exemplary InAlN/GaN HEMTs on Si substrate prepared in accordance with embodiments of the invention. To obtain the detailed 2DEG electron density, the energy band structure can be simulated using the self-consistent Poisson-Schrodinger equations.

Figure 7C:
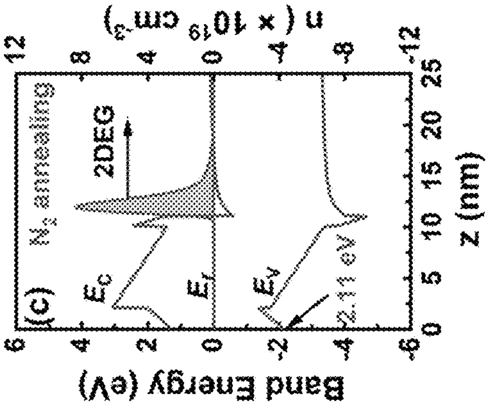
Figure 7D:
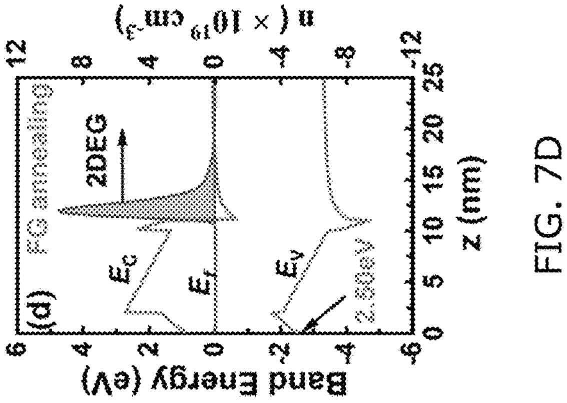

FIGS. 7C and 7D show the simulated energy band structure and electron concentration distribution as a function of distance (z) from the material surface for both samples. The ($E_f$-$E_v$) of 2.11 and 2.50 eV (obtained from valence band edge spectra) are used for the energy band simulation. Considering the GaN band gap of 3.4 eV, $E_c$-$E_f$ ($E_c$ is the conductance energy minimum) of 1.29 and 0.9 eV are obtained. Hence, the surface barrier height ($\varphi_b$, here $\varphi_b$=$E_c$−$E_f$) can be determined to be 1.29 ($N_2$ annealing) and 0.9 eV (FG annealing), respectively. The reduction in surface barrier height can result in the increase of 2DEG density.

As shown in FIGS. 7C and 7D, the higher peak of the electron concentration (n) presents the increased 2DEG electron density. Here the 2DEG electron density (neo) can be extracted from the energy band simulation. The neo of a sample of the exemplary InAlN/GaN HEMTs on Si substrate prepared in accordance with embodiments of the invention, and is subjected to an FG annealing step is $1.91\times10^{13}$ $cm^{-2}$, which corresponds to a 10% percent increase as compared to that of the sample with $N_2$ annealing ($1.75\times10^{13}$ $cm^{-2}$). Therefore, FG annealing can effectively decrease the surface barrier height and increase 2DEG electrons in InAlN/GaN heterostructure, such as that found in the exemplary InAlN/GaN HEMTs on Si substrate prepared in accordance with embodiments of the invention.

Capacitance-Voltage (C-V) Measurements

Figure 8B:
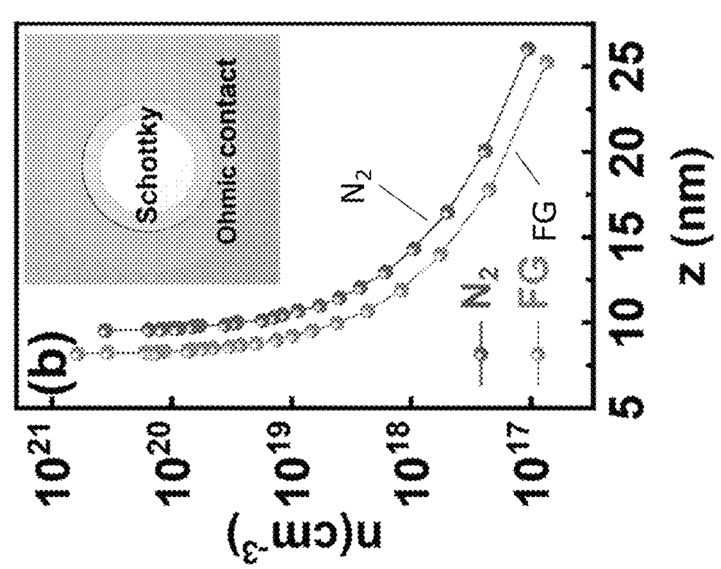
FIGS. 8A-8B are graphs depicting exemplary capacitance-voltage (C-V) measurements with a frequency of 1 MHz performed on the semiconductor device of FIGS. 2A-2B after the annealing steps of FIG. 1.
Figure 8A:
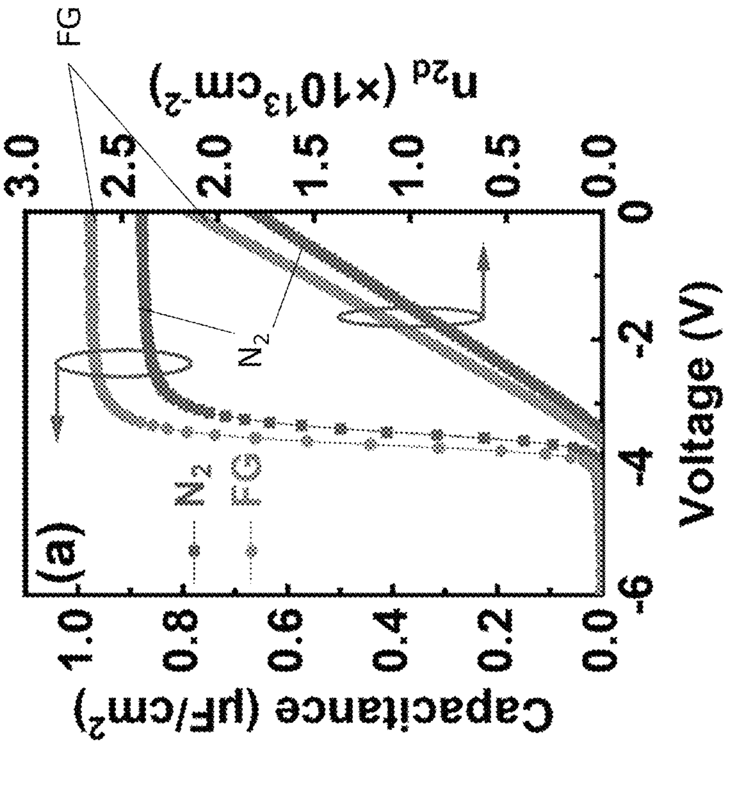

To assess the influence of trap electrons, the capacitance-voltage measurement with a frequency of 1 MHz is performed as shown in FIG. 8A. The circular Schottky diodes are fabricated for the C-V measurement and the device schematic is shown in the insert of FIG. 8B. During the ohmic contact annealing steps (as described in methods 100 and/or 300 above), $N_2$ annealing is applied on a sample of the exemplary InAlN/GaN HEMTs on Si substrate prepared in accordance with embodiments of the invention, and FG annealing is applied on another sample. The measured capacitance (C) under voltage of 0 V increases from 0.879 ($C_{N2}$, with $N_2$ annealing) to 0.976 μF/$cm^2$ ($C_{FG}$, with FG annealing). For the sample with $N_2$ annealing, the native oxide can introduce an oxide capacitance. The oxide capacitance ($C_{ox}$) is in series with the barrier capacitance ($C_b$), resulting in $1/C_{N2}=1/C_{ox}+1/C_b$. The removed native oxide with FG annealing leads to $C_{FG}$, with the value equal to $C_b$. Hence, the introduced $C_{ox}$ can decrease the total capacitance. The 2DEG electron density can be calculated using the integration of capacitance-voltage curves and is shown in the equation below, where e is the electron charge, and A is the schottky contact area:

$$n_{2d} = \frac{1}{eA}\int_{V_T}^{V} CdV$$

FIG. 8A shows the calculated $n_{2d}$ as a function of voltage. At the voltage of 0 V, the 2DEG electron density are $1.82\times10^{13}$ ($N_2$) and $2.15\times10^{13}$ $cm^{-2}$ (FG), respectively. The increased neo with FG annealing is consistent with the results from energy band simulations. Here, both of the neo calculated with C-V curves are higher than those determined from the simulated energy bands. Although the high frequency of 1 MHz has been used during capacitance measurement, the influence of trap electrons cannot be neglected. The trap electrons will contribute to the 2DEG electrons in the capacitance integration calculation method, leading to the increased calculated $n_{2D}$.

The electron concentration distribution versus the distance (z) from the material surface can also be calculated using the measured C-V curves, as calculated by the following equation below, where ε is the dielectric constant of the barrier layer:

$$n = -\frac{2}{e\varepsilon A^2}\cdot\frac{1}{d(1/C^2)/dV}$$

As shown in FIG. 8B, the sample with FG annealing shows a rapid decrease with z. This decrease means that most of the 2DEG electrons are confined in the potential well and a thinner channel layer is formed with FG annealing. A thinner channel is easier to be modulated by the gate voltage. Hence a stronger electron confinement can effectively improve several properties, including but not limited to, the gate control capacity, which is beneficial for decreasing the leakage current, improving $I_{on}/I_{off}$ current ratio, reducing subthreshold swing (SS), and suppressing the short-channel effect in GaN HEMT devices.

In addition, to confirm the variation of 2DEG the electron system, Hall measurement (not shown) is carried out on the InAlN/GaN heterostructure with $N_2$ and FG annealing, respectively. The results show that $n_{2d}$ increases from $1.60\times10^{13}$ $cm^{-2}$ ($N_2$ annealing) to $1.94\times10^{13}$ $cm^{-2}$ (FG annealing). Due to the improved surface properties, the 2DEG electron mobility ($\mu_{2d}$) is also enhanced from 1242 $cm^2/V\cdot s$ ($N_2$ annealing) to 1358 $cm^2/V\cdot s$ (FG annealing), presenting a significant influence of annealing ambient on the InAlN/GaN HEMT device characteristics.

Ohmic Contact Resistance

Figure 9B:
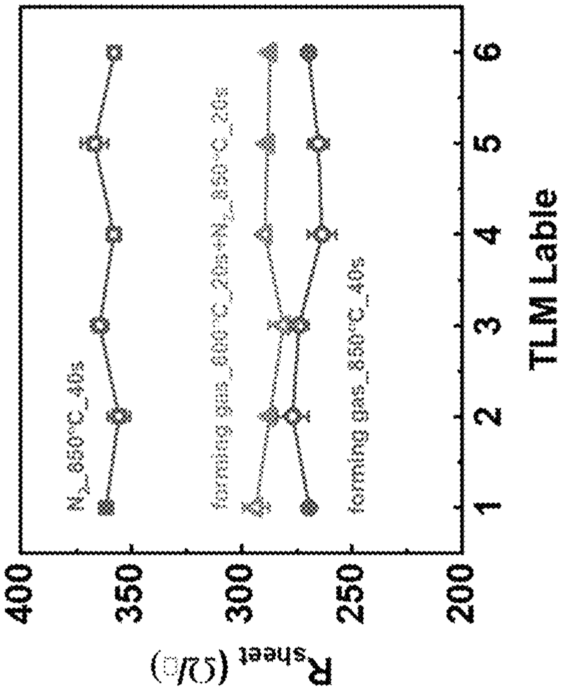
FIGS. 9A-9B are graphs depicting the Ohmic contact resistance ($R_C$) and sheet resistance ($R_{sheet}$) for exemplary annealing conditions in accordance with aspects of the invention.
Figure 9A:
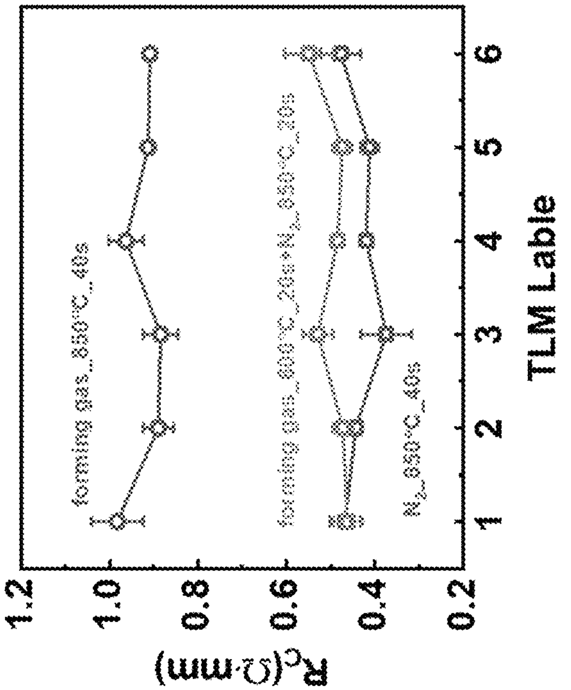

FIGS. 9A and 9B show the Ohmic contact resistance ($R_C$) and sheet resistance ($R_{sheet}$) for three types of annealing conditions obtained using six sets of TLM patterns. The three types of annealing conditions are: $N_2$ annealing at 850° C. for 40 seconds; FG annealing at 850° C. for 40 seconds; and FG/$N_2$ annealing at 800° C. for 20 seconds in FG and 850° C. in $N_2$ for 20 seconds. The average values of $R_C$ are 0.43 Ω·mm ($N_2$ annealing), 0.92 Ω·mm (FG annealing), and 0.49 Ω·mm (FG/$N_2$ annealing), respectively. The average values of $R_{sheet}$ are 361Ω/□ (ohms per square)($N_2$ annealing), 269Ω/□ (FG annealing), and 288Ω/□ (FG/$N_2$ annealing), respectively.

$N_2$ annealing shows the lowest $R_C$ and highest $R_{sheet}$, and FG annealing presents the opposite behavior (i.e., highest $R_C$ and lowest $R_{sheet}$). As discussed above, FG annealing can effectively remove the native oxide and increase the 2DEG electron density, leading to the decrease of $R_{sheet}$. However, the increased $R_C$ from FG annealing can degrade the device performance. In order to benefit from the good material property due to FG annealing and the low $R_C$ due to $N_2$ annealing, a FG/$N_2$ two-step annealing process is applied and an improved device performance is obtained. Namely, the two-step annealing process in FG and $N_2$ optimizes contact metal stack for source and drain contact, as both $R_C$ and $R_{sheet}$ are reduced, thereby minimizing total resistance and enhancing RF performance. This is consistent with the exemplary methods 100 and 300 including an FG/$N_2$ two-step annealing process to fabricate an exemplary InAlN/GaN HEMT on Si substrate device in accordance with embodiments of the invention.

Device Performance Assessment

Figure 10A:
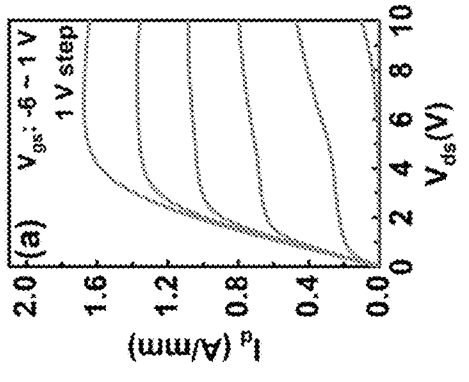
FIGS. 10A-10D are graphs depicting exemplary device performance measurements performed on the semiconductor device of FIGS. 2A-2B.
Figure 10B:
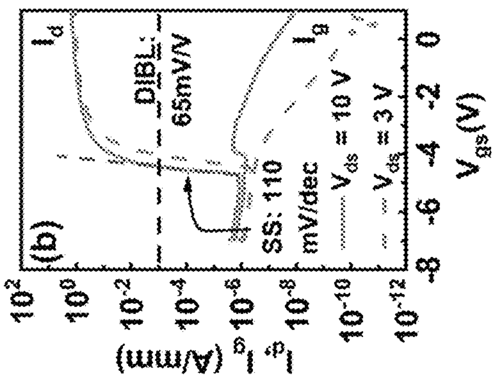
Figure 10C:
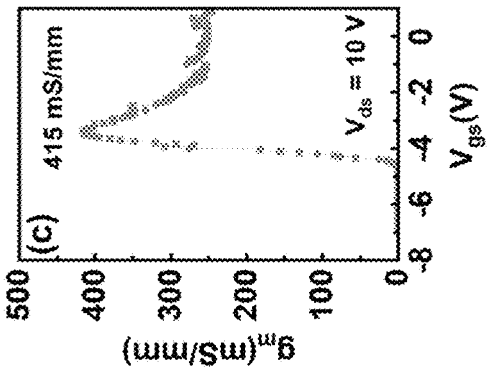

FIG. 10A shows the output characteristic of an exemplary InAlN/GaN HEMT on Si substrate device in accordance with embodiments of the invention. In particular, FIG. 10A shows the output characteristic of a 50-nm gate length InAlN/GaN HEMT with FG/$N_2$ annealing. FIG. 10B shows the transfer and gate current characteristics in semi-log scale at $V_{ds}$ of 10 V and 3 V, respectively. At $V_{ds}$=10 V, $I_{on}/I_{off}$ ratio of ~$10^6$ and an SS of 110 mV/dec are observed. The DIBL of 65 mV/V is extracted at $I_d$=10 mA/mm between $V_{ds}$=10 V and $V_{ds}$=3V. According to prior art, this is the lowest value among all GaN HEMTs on Si substrate. The breakdown voltage (BV) is 20 V as determined at $I_d$=1 mA/mm when $V_{gs}$ is fixed at −8 V. FIG. 10C shows the extracted extrinsic transconductance ($g_m$) at $V_{ds}$ of 10 V and a $g_m$ peak ($g_{m,peak}$) of 415 mS/mm.

Figure 10D:
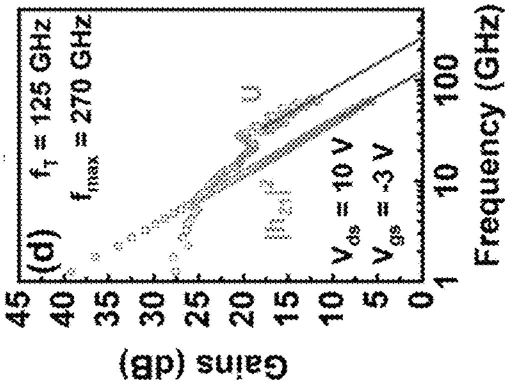

The RF measurement is taken with Anritsu MS4647B vector network analyzer configured to operate from 1 to 65 GHz. The network analyzer is calibrated using Line Reflect Match (LRM) calibration. On-wafer open and short structures are used to eliminate the effects of parasitic elements. After de-embedding, the current gain ($|h_{21}|^2$) and unilateral gain (U) as a function of frequency at $V_{ds}$=10 V, $V_{gs}$=−3 V are plotted in FIG. 10D. A $f_T/f_{max}$ of 125/270 GHz is extracted using extrapolation of $|h_{21}|^2$ and U with a −20 dB/dec slope, resulting in $f_T\cdot L_g$ of 6.25 GHz·μm.

Figure 11:
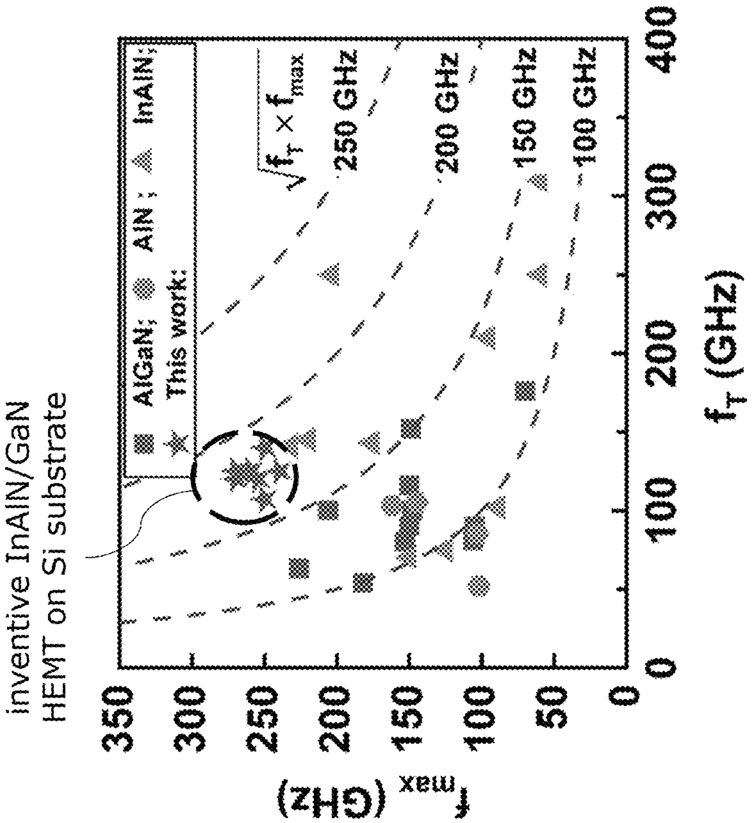
FIG. 11 depict a comparison of a measured balanced current/power gain cutoff frequency ($f_T/f_{max}$) performed on the semiconductor device of FIGS. 2A-2B and reported measurements from prior art.

FIG. 11 shows the comparison of $f_T/f_{max}$ of an exemplary InAlN/GaN HEMTs on Si substrate in accordance with embodiments of the invention with those from alternative or reported GaN HEMTs on Si substrate. As shown in FIG. 11, exemplary InAlN/GaN HEMTs on Si substrate prepared with an FG annealing step, as described herein, present the highest $f_{max}$ among the reported GaN HEMTs on Si. In an exemplary embodiment, exemplary InAlN/GaN HEMTs on Si substrate exhibit an $f_T$ of 215 GHz and/or an $f_{max}$ of 270 GHz.

Thus, the improved surface characteristic and 2DEG electron density with FG annealing are demonstrated by the above-described tests and results. With the developed FG/$N_2$ ohmic contact annealing technology, the 50-nm gate length InAlN/GaN HEMT on Si exhibits an average SS of 110 mV/dec, a record low DIBL of 65 mV/V, a $g_{m,peak}$ of 415 mS/mm, and a record high $f_{max}$ of 270 GHz.

This fabrication technology for GaN HEMTs on Si yields excellent RF characteristics, which indicates the great application potential of GaN-on-Si for products, including but not limited to millimeter wave power amplifiers. Further, GaN HEMTs, such as the exemplary InAlN/GaN HEMTs on Si substrate prepared in accordance with embodiments of the invention, are excellent candidates for enhancing 5G wireless applications due to the high frequency and high power capabilities. Still further, GaN HEMTs, such as the exemplary InAlN/GaN HEMTs on Si substrate prepared in accordance with embodiments of the invention, are also compatible with complementary metal-oxide-semiconductor (COMS) technology and provide more cost effective solutions compared to HEMTs on SiC counterparts.

Figure 6B:
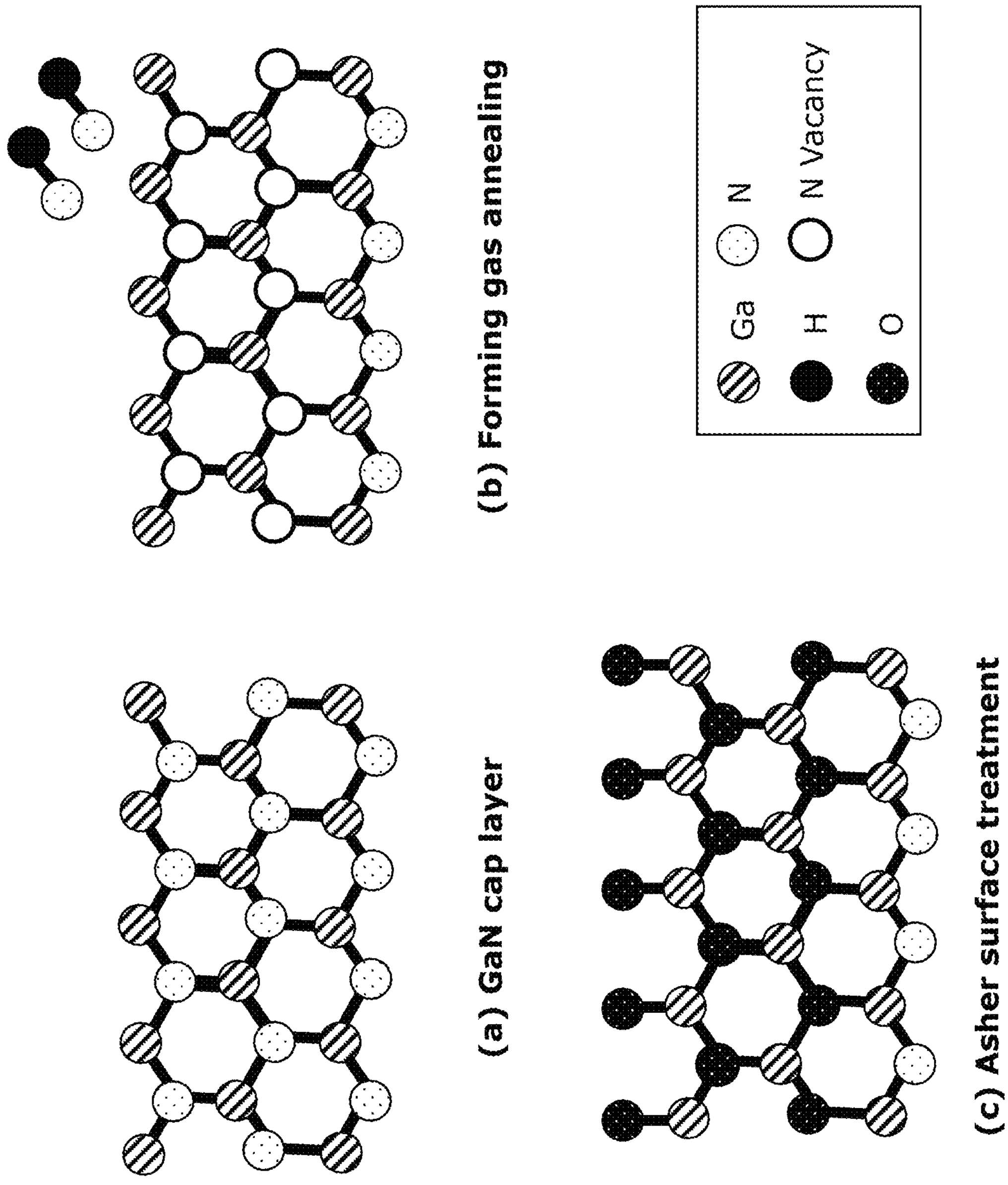

Referring now to FIGS. 6B, 12, and 13A-13C, additional tests of device performance is assessed. As shown in FIG. 6B, step 160 of method 100 may comprise subjecting semiconductor layer surface 222 to an oxygen plasma treatment, using a plasma asher, such as the Branson IPC3000 $O_2$ Asher, as described and manufactured by Allwin21 Corp. of Morgan Hill, CA. In an exemplary embodiment, the plasma asher is operated at 800 W for 1 min).

Figure 12:
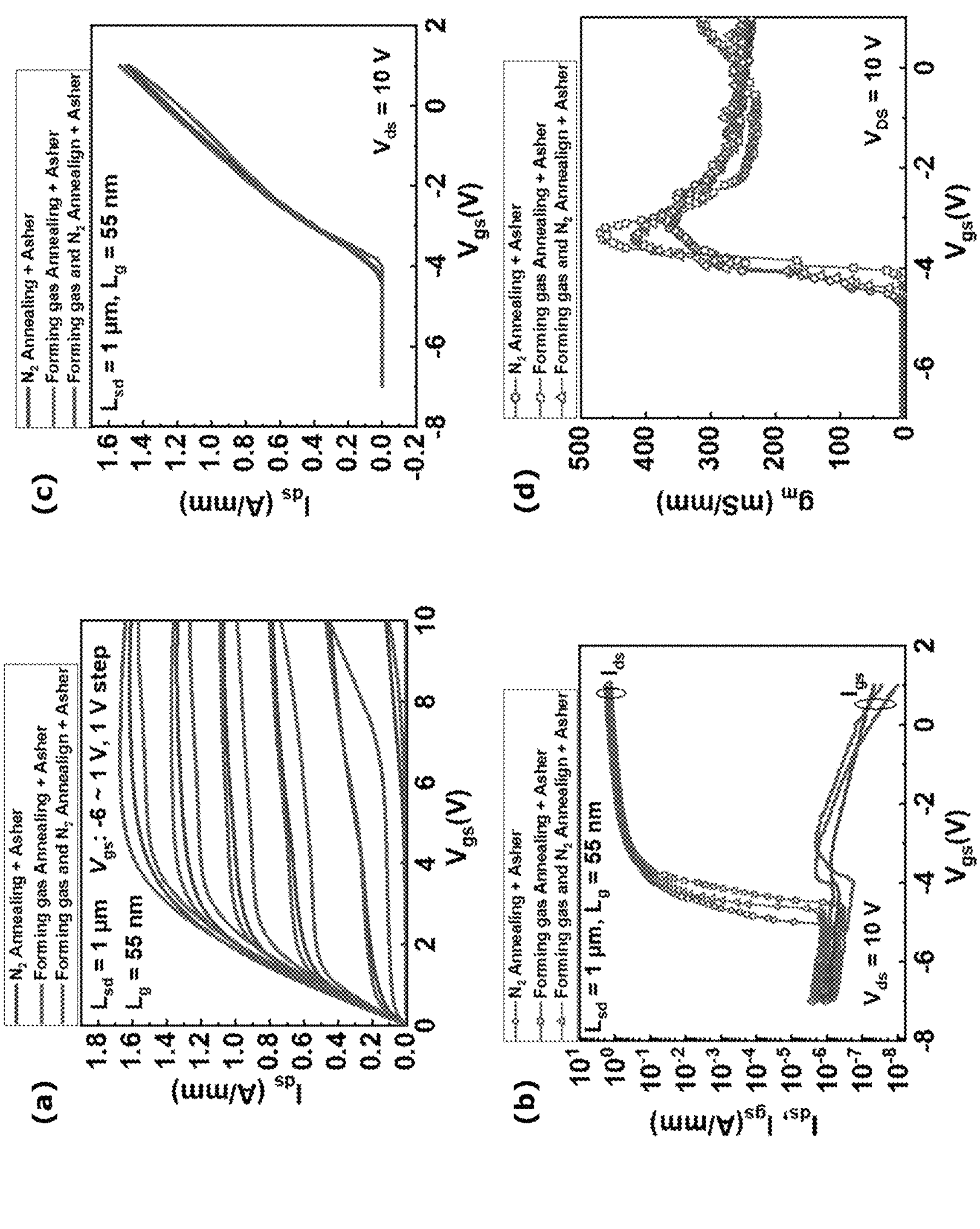
FIG. 12 are graphs depicting exemplary current-voltage (I-V) measurements performed on the semiconductor device of FIGS. 2A-2B.

Similar to the device performance assessment discussed above with respect to FIGS. 10A-10D, graph (a) of FIG. 12 shows the output characteristic of an exemplary InAlN/GaN HEMTs on Si substrate in accordance with embodiments including the Asher surface treatment. In particular, graph (a) of FIG. 12 shows the output characteristic of a 50-nm gate length InAlN/GaN HEMT subjected to the following conditions: $N_2$ annealing+Asher; FG annealing+Asher; and FG/$N_2$ annealing+Asher.

Graph (b) of FIG. 12 shows the transfer and gate current characteristics in semi-log scale at $V_{ds}$ of 10 V. At $V_{ds}$=10 V, $I_{on}/I_{off}$ ratio of ~$10^6$.

Graph (c) of FIG. 12 shows the transfer curves in linear scale for the exemplary sample(s) of 50-nm gate length InAlN/GaN HEMT subjected to the three conditions, respectively. The exemplary sample transistor that was treated with FG annealing shows the lowest saturation current due to its high contact resistance. The exemplary sample transistor treated with the inventive FG/$N_2$ annealing shows the highest saturation current due to its higher gate capacitance.

Graph (d) of FIG. 12 shows the extracted extrinsic transconductance ($g_m$) at $V_{ds}$ of 10 V and a $g_m$ peak ($g_{m,peak}$) of over 400 mS/mm for samples subjected to the following conditions: FG annealing+Asher and FG/$N_2$ annealing+Asher. The extracted extrinsic transconductance ($g_m$) at $V_{ds}$ of 10 V and a $g_m$ peak ($g_{m,peak}$) of under 400 mS/mm is shown for samples subjected to $N_2$ annealing+Asher.

Figure 13A:
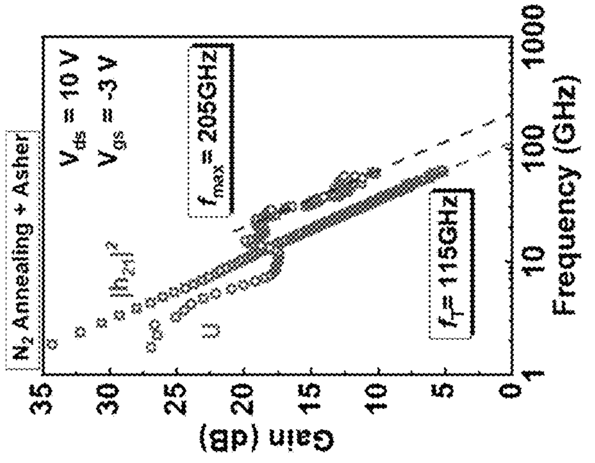
FIGS. 13A-13C are graphs depicting exemplary balanced current/power gain cutoff frequency ($f_T/f_{max}$) measurements performed on the semiconductor device of FIGS. 2A-2B.
Figure 13B:
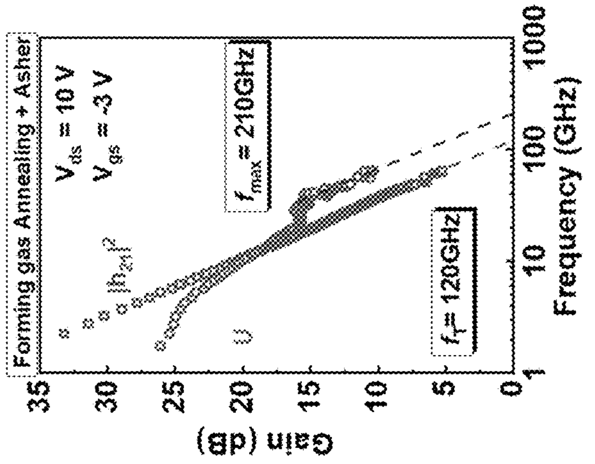
Figure 13C:
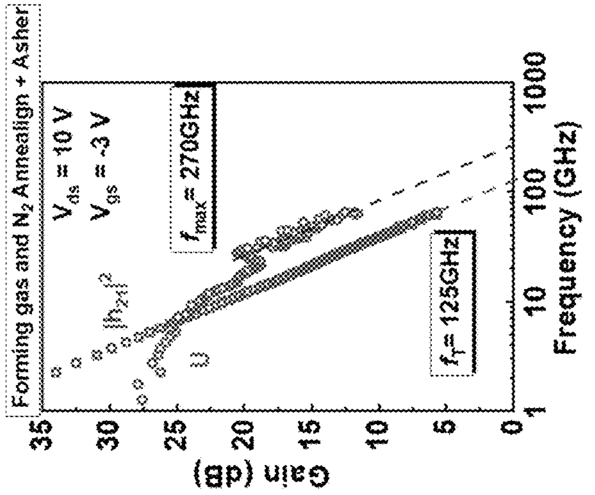

Turning to FIGS. 13A-13C, the RF measurement is taken with Anritsu MS4647B vector network analyzer configured to operate from 1 to 65 GHz. The network analyzer is calibrated using Line Reflect Match (LRM) calibration. On-wafer open and short structures are used to eliminate the effects of parasitic elements. After de-embedding, the current gain ($|h_{21}|^2$) and unilateral gain (U) as a function of frequency at $V_{ds}$=10 V, $V_{gs}$=−3 V are plotted in FIGS. 13A-13C. For $N_2$ annealing+Asher, as shown in FIG. 13A, a $f_T/f_{max}$ of 115/205 GHz is extracted using extrapolation of $|h_{21}|^2$ and U with a −22.5 dB/dec slope. For FG annealing+Asher, as shown in FIG. 13B, a $f_T/f_{max}$ of 120/210 GHz is extracted using extrapolation of $|h_{21}|^2$ and U with a −20 dB/dec slope. For FG/$N_2$ annealing+Asher, as shown in FIG. 13C, a $f_T/f_{max}$ of 125/270 GHz is extracted using extrapolation of $|h_{21}|^2$ and U with a −24 dB/dec slope.

Thus, various aspects of the invention include but are not limited to the following.

Aspect 1: A method of fabricating a semiconductor device, the method comprising:

(a) depositing an epitaxial layer over a substrate to form a semiconductor layer surface;

(b) subjecting the semiconductor layer surface to an etching process for forming at least one mesa portion;

(c) depositing a metal stack on the semiconductor layer surface;

(d) subjecting the semiconductor layer surface to a rapid thermal annealing (RTA) system for ohmic contact annealing in forming gas (FG), the FG comprising H2 and N2;

(e) subjecting the semiconductor layer surface to the RTA system for ohmic contact annealing in nitrogen (N2);

(f) subjecting the semiconductor layer surface to an oxygen plasma treatment; and (g) depositing a T-shaped metal gate on the semiconductor layer surface.

Aspect 2: The method of Aspect 1, wherein the substrate comprises silicon.

Aspect 3: The method of Aspect 1 or Aspect 2, wherein the epitaxial layer is deposited over the substrate using metal organic chemical vapor deposition (MOCVP).

Aspect 4: The method of any one of the foregoing Aspects, wherein the epitaxial layer comprises:

a buffer layer comprising gallium nitride (GaN);

a back barrier layer formed on the buffer layer, the back barrier layer comprising InyGa1−yN, wherein y is between 0.05 and 0.2;

a channel layer formed on the back barrier layer, the channel layer comprising GaN;

an interlayer formed on the channel layer, the interlayer comprising AlN;

a lattice-matched barrier layer formed on the interlayer, the lattice-matched barrier layer comprising InxAl1−xN, wherein x is between 0 and 0.3; and a cap layer formed on the lattice-matched barrier layer, the cap layer comprising GaN.

Aspect 5: The method of Aspect 4, wherein the etching treatment removes material from a portion of the epitaxial layer.

Aspect 6: The method of any one of the foregoing Aspects, comprising performing the etching treatment using an inductively coupled plasma (ICP) generator.

Aspect 7: The method of any one of the foregoing Aspects, comprising performing the etching treatment using a chlorine (C12)-based ICP generator.

Aspect 8: The method of Aspect 5, wherein the at least one mesa portion is formed by removing material from a portion of the buffer layer of the epitaxial layer, such that a ledge of the buffer layer is formed.

Aspect 9: The method of any one of the foregoing Aspects, wherein the metal stack comprises titanium (Ti), Al, or a combination thereof.

Aspect 10: The method of any one of the foregoing Aspects, wherein the metal stack comprises Ti, Al, nickel (Ni), gold (Au), or combination thereof.

Aspect 11: The method of any one of the foregoing Aspects, wherein the semiconductor layer surface is annealed between 700° C. and 900° C. in FG.

Aspect 12: The method of any one of the foregoing Aspects, wherein the semiconductor layer surface is annealed in FG for between 10 and 50 seconds.

Aspect 13: The method of any one of the foregoing Aspects, wherein the semiconductor layer surface is annealed between 750° C. and 950° C. in N2.

Aspect 14: The method of any one of the foregoing Aspects, wherein the semiconductor layer surface is annealed in N2 for between 10 and 50 seconds.

Aspect 15: The method of any one of the foregoing Aspects, wherein step (e) occurs after step (d).

Aspect 16: The method of any one of the foregoing Aspects, wherein FG comprises 5% of H2 and 95% of N2.

Aspect 17: The method of any one of the foregoing Aspects, wherein the T-shaped metal gate is formed on the semiconductor layer surface by electron beam lithography.

Aspect 18: The method of any one of the foregoing Aspects, wherein the T-shaped metal gate comprises Ni, Au, or a combination thereof, with a gate width (Wg) of 2×20 μm.

Aspect 19: The method of any one of the foregoing Aspects, wherein at least step (d) occurs before step (g).

Aspect 20: The method of any one of the foregoing Aspects, wherein the semiconductor device comprises a high electron mobility transistor (HEMT).

Aspect 21: The method of Aspect 20, wherein the semiconductor device comprises a 50-nm gate length InAlN/GaN HEMT on Si having improved surface properties.

Aspect 22: The method of Aspect 21, wherein the improved surface properties comprises improvements in at least channel electron density, leakage current, subthreshold swing (SS), noise, or combination thereof.

Aspect 23: The method of Aspect 22, wherein the improved surface properties comprise one or more of an SS of between 90 and 140 mV/dec, a transconductance (gm) peak of between 315 and 515 mS/mm, a low draw-induced barrier lowing (DIBL) of 50 and 80 mV/V, and high power gain cutoff frequency (fmax) of between 200 and 340 GHz.

Aspect 24: The method of Aspect 23, wherein the improved surface properties comprises one or more of an SS of 110 mV/dec, a transconductance (gm) peak of 415 mS/mm, a low draw-induced barrier lowing (DIBL) of 65 mV/V, and high power gain cutoff frequency (fmax) of 270 GHz.

Aspect 25: The method of any one of the foregoing Aspects, wherein no passivation process is applied to the semiconductor device.

Aspect 26. A semiconductor device having improved (radio frequency) RF performance comprising:

a semiconductor layer surface including an epitaxial layer over a substrate comprising silicon;

at least one mesa portion formed on the semiconductor layer surface;

a metal stack on the semiconductor layer surface, the metal stack being sequentially annealed in FG and then in N2, each for a predetermined duration; and a T-shaped metal gate on the semiconductor layer surface.

Aspect 27: The semiconductor device of Aspect 26, wherein the silicon substrate has a thickness between 2 and 6 inches.

Aspect 28: The semiconductor device of Aspects 26 or 27, wherein the epitaxial layer comprises:

a buffer layer comprising a group III-nitride material;

a back barrier layer formed on the buffer layer, the back barrier layer comprising at least In or Al;

a channel layer formed on the back barrier layer, the channel layer comprising a group III-nitride material;

an interlayer formed on the channel layer, the interlayer comprising Al;

a lattice-matched barrier layer formed on the interlayer, the lattice-matched barrier layer comprising InxAl1-xN; and a cap layer formed on the lattice-matched barrier layer, the cap layer comprising a group III-nitride material.

Aspect 29: The semiconductor device of Aspect 28, wherein the group III-nitride material comprises GaN.

Aspect 30: The semiconductor device of Aspects 28 or 29, wherein the buffer layer has a thickness of between 1 μm and 3 μm.

Aspect 31: The semiconductor device of any one of Aspects 28-30, wherein the buffer layer comprises a 2-μm undoped GaN buffer layer.

Aspect 32: The semiconductor device of any one of Aspects 28-31, wherein the back barrier layer comprises InyGa1-yN and y is between 0.05 and 0.2.

Aspect 33: The semiconductor device of any one of Aspects 28-32, wherein the back barrier layer has a thickness of between 1 nm and 7 nm.

Aspect 34: The semiconductor device of any one of Aspects 28-33, wherein the back barrier layer comprises a 4-nm In0.12Ga0.88N back barrier layer.

Aspect 35: The semiconductor device of any one of Aspects 28-34, wherein the channel layer comprises GaN.

Aspect 36: The semiconductor device of any one of Aspects 28-35, wherein the channel layer has a thickness of between 10 nm and 20 nm.

Aspect 37: The semiconductor device of any one of Aspects 28-36, wherein the channel layer comprises a 15-nm GaN channel layer.

Aspect 38: The semiconductor device of any one of Aspects 28-37, wherein the interlayer comprises aluminum nitride (AlN).

Aspect 39: The semiconductor device of any one of Aspects 28-38, wherein the interlayer has a thickness of between 0.1 nm and 2.1 nm.

Aspect 40: The semiconductor device of any one of Aspects 28-39, wherein the interlayer comprises a 1-nm AlN interlayer.

Aspect 41: The semiconductor device of any one of Aspects 28-40, wherein the lattice-matched barrier layer comprises InxAl1-xN and x is between 0 and 0.3.

Aspect 42: The semiconductor device of any one of Aspects 28-41, wherein the lattice-matched barrier layer has a thickness of between 5 nm and 11 nm.

Aspect 43: The semiconductor device of any one of Aspects 28-42, wherein the lattice-matched barrier layer comprising an 8-nm lattice-matched In0.17Al0.83N barrier layer.

Aspect 44: The semiconductor device of any one of Aspects 28-43, wherein the cap layer comprises GaN.

Aspect 45: The semiconductor device of any one of Aspects 28-44, wherein the cap layer has a thickness of between 0 nm and 4 nm.

Aspect 46: The semiconductor device of any one of Aspects 28-45, wherein the cap layer comprises a 2-nm GaN cap layer.

Aspect 47: The semiconductor device of any one of Aspects 28-46, wherein the semiconductor device includes a source-drain spacing (Lsd) of between 0 and 2 μm.

Aspect 48: The semiconductor device of any one of Aspects 28-47, wherein the semiconductor device includes a gate-source spacing (Lgs) of between 375 and 575 nm.

Aspect 49: The semiconductor device of any one of Aspects 28-48, wherein the semiconductor device has a gate footprint (Lg) of between 30 and 70 nm.

Aspect 50. A method of subjecting a semiconductor layer surface to post-metallization annealing, the method comprising:

(a) subjecting the semiconductor layer surface to a pre-anneal phase, the pre-anneal phase comprising heating to a first temperature for a first predetermined duration;

(b) subjecting the semiconductor layer surface to a first anneal phase, the first anneal phase comprising subjecting the semiconductor layer surface to an RTA system for ohmic contact annealing in FG; and (c) subjecting the semiconductor layer surface to a second anneal phase, the second anneal phase comprising subjecting the semiconductor layer surface to the RTA system for ohmic contact annealing in N2;

(d) subjecting the semiconductor layer surface to a post-anneal phase, the post-anneal phase comprising heating to a second temperature; and wherein step (c) occurs after step (b).

Aspect 51: The method of Aspect 50, wherein the first temperature is between 15° C. and 35° C. and the first predetermined duration is between 30 to 90 seconds.

Aspect 52: The method of Aspects 50 or 51 wherein the second temperature is between 15° C. and 35° C.

Aspect 53: The method of any one of Aspects 50-52, wherein step (b) comprises annealing the semiconductor layer surface between 700° C. and 900° C. in FG.

Aspect 54: The method of any one of Aspects 50-53, wherein step (b) comprises annealing the semiconductor layer surface in FG for between 10 and 50 seconds.

Aspect 55: The method of any one of Aspects 50-54, wherein step (c) comprises annealing the semiconductor layer surface between 750° C. and 950° C. in N2.

Aspect 56: The method of any one of Aspects 50-55, wherein step (c) comprises annealing the semiconductor layer surface in N2 for between 10 and 50 seconds.

Aspect 57: The method of any one of Aspects 50-56, wherein FG comprises 5% of H2 and 95% of N2.

Aspect 58: The method of any one of Aspects 50-57, wherein step (d) comprises annealing the semiconductor layer surface in FG.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of fabricating a semiconductor device, the method comprising:

(a) depositing an epitaxial layer over a substrate to form a semiconductor layer surface;

(b) subjecting the semiconductor layer surface to an etching process for forming at least one mesa portion;

(c) depositing a metal stack on the semiconductor layer surface;

(d) subjecting the semiconductor layer surface to a rapid thermal annealing (RTA) system for ohmic contact annealing in forming gas (FG) comprising $H_2$ and $N_2$;

(e) subjecting the semiconductor layer surface to the RTA system for ohmic contact annealing in nitrogen ($N_2$); and wherein the epitaxial layer comprises:

a buffer layer comprising gallium nitride (GaN);

a back barrier layer formed on the buffer layer, the back barrier layer comprising $In_yGa_{1-y}N$, wherein y is in a range of 0.05-0.2;

a channel layer formed on the back barrier layer, the channel layer comprising GaN;

an interlayer formed on the channel layer, the interlayer comprising AlN;

a lattice-matched barrier layer formed on the interlayer, the lattice-matched barrier layer comprising $In_xAl_{1-x}N$, wherein x is 0.17; and a cap layer formed on the lattice-matched barrier layer, the cap layer comprising GaN.

2. The method of claim 1, wherein the substrate comprises silicon, and further comprising:

(f) subjecting the semiconductor layer surface to an oxygen plasma treatment; and (g) depositing a T-shaped metal gate on the semiconductor layer surface.

3. The method of claim 1, wherein the epitaxial layer is deposited over the substrate using metal organic chemical vapor deposition (MOCVD).

4. The method of claim 2, wherein the T-shaped metal gate comprises Ni, Au, or a combination thereof.

5. The method of claim 2, wherein step (e) occurs after step (d) and at least step (d) occurs before step (g), and FG comprises 5% $H_2$ and 95% $N_2$.

6. The method of claim 1, wherein the etching treatment removes material from a portion of the epitaxial layer, and the at least one mesa portion is formed by removing material from a portion of the buffer layer of the epitaxial layer, such that a ledge of the buffer layer is formed.

7. The method of claim 1, wherein the metal stack comprises titanium (Ti), aluminum (AI), nickel (Ni), or gold (Au).

8. The method of claim 1, wherein the semiconductor device comprises a high electron mobility transistor (HEMT).

9. The method of claim 8, wherein the semiconductor device comprises a 50-nm gate length an indium aluminum nitride/gallium nitride high electron mobility transistor (InAlN/GaN HEMT) on a silicon (Si) substrate (InAlN/GaN HEMT on Si semiconductor device).

10. The method of claim 9, wherein the 50-nm gate length InAlN/GaN HEMT on Si semiconductor device has surface properties including one or more of: a subthreshold swing (SS) in a range of 90-140 mV/dec, a transconductance ($g_m$) peak in a range of 315-515 mS/mm, a low draw-induced barrier lowing (DIBL) in a range of 50-80 mV/V, and high power gain cutoff frequency ($f_{max}$) in a range of 200-340 GHz.

11. The method of claim 1, wherein no passivation process is applied to the semiconductor device.

12. A semiconductor device comprising:

a semiconductor layer surface including an epitaxial layer over a substrate comprising silicon;

at least one mesa portion formed on the semiconductor layer surface;

a metal stack on the semiconductor layer surface, the metal stack being sequentially annealed in FG comprising $H_2$ and $N_2$ and then in $N_2$, each for a predetermined duration; and a T-shaped metal gate on the semiconductor layer surface; and wherein the epitaxial layer comprises:

a buffer layer comprising a group III-nitride material;

a back barrier layer formed on the buffer layer, the back barrier layer comprising at least In;

a channel layer formed on the back barrier layer, the channel layer comprising a group III-nitride material;

an interlayer formed on the channel layer, the interlayer comprising Al;

a lattice-matched barrier layer formed on the interlayer, the lattice-matched barrier layer comprising $In_xAl_{1-x}N$; and a cap layer formed on the lattice-matched barrier layer, the cap layer comprising a group III-nitride material.

13. The semiconductor device of claim 12, wherein the back barrier layer has a thickness in a range of 1-7 nm and comprises $In_{0.12}Ga_{0.88}N$.

14. The semiconductor device of claim 13, wherein one or more of:

the buffer layer has a thickness in a range of 1-3 μm;

the back barrier layer comprises InyGa1-yN, wherein y is in a range of 0.05-0.2;

the channel layer comprises GaN;

the channel layer has a thickness in a range of 10-20 nm;

the interlayer comprises aluminum nitride (AlN);

the interlayer has a thickness in a range of 0.1-2.1 nm;

the lattice-matched barrier layer comprises $In_xAl_{1-x}N$, wherein x is in a range of 0-0.3;

the lattice-matched barrier layer has a thickness in a range of 5-11 nm;

the cap layer comprises GaN;

the cap layer has a thickness in a range of 0-4 nm.

15. The semiconductor device of claim 14, having one or more of a source-drain spacing ($L_{sd}$) in a range of 0-2 μm;

a gate-source spacing ($L_{gs}$) in a range of 375-575 nm; and a gate footprint ($L_g$) in a range of 30-70 nm.

16. The semiconductor device of claim 13, wherein one or more of:

the buffer layer comprises 2-μm undoped GaN;

the lattice-matched barrier layer comprises 8-nm $In_{0.17}Al_{0.83}N$; and the cap layer comprises 2-nm GaN.

17. The semiconductor device of claim 12, wherein the epitaxial layer includes a 2-nm GaN cap layer, an 8-nm lattice-matched $In_{0.17}Al_{0.83}N$ barrier layer, a 1-nm AlN interlayer, a 15-nm GaN channel layer, a 4-nm $In_{0.12}Ga_{0.88}N$ back barrier layer, and a 2-μm undoped GaN buffer layer.

18. A method of subjecting a semiconductor layer surface to post-metallization annealing, the method comprising:

(a) subjecting the semiconductor layer surface to a first anneal phase, the first anneal phase comprising subjecting the semiconductor layer surface to a rapid thermal annealing (RTA) system for ohmic contact annealing in forming gas (FG) comprising $H_2$ and $N_2$;

(b) subjecting the semiconductor layer surface to a second anneal phase, the second anneal phase comprising subjecting the semiconductor layer surface to the RTA system for ohmic contact annealing in $N_2$;

(c) subjecting the semiconductor layer surface to a pre-anneal phase, the pre-anneal phase comprising heating to a first temperature for a first predetermined duration, the first temperature is in a range of 15-35° C. and the first predetermined duration is in a range of 30-90 seconds;

(d) subjecting the semiconductor layer surface to a post-anneal phase, the post-anneal phase comprising heating to a second temperature, the second temperature is in a range of 15-35° C.; and wherein:

step (b) occurs after step (a);

step (a) further comprises annealing the semiconductor layer surface in FG at a temperature in a range of 700-900° C. for a duration in a range of 10-50 seconds;

step (b) further comprises annealing the semiconductor layer surface in $N_2$ at a temperature in a range of 750-950° C. for a duration in a range of 10-50 seconds; and step (d) further comprises annealing the semiconductor layer surface in FG.

19. The method of claim 18, wherein FG comprises 5% of $H_2$ and 95% of $N_2$.

20. The method of claim 18, wherein the second temperature is between 15° C. and 35° C.

21. The method of claim 20, wherein the first temperature is 25° C. and the first predetermined duration is 60 seconds, and wherein the second temperature is 25° C.

22. The method of claim 18, wherein step (a) comprises annealing the semiconductor layer surface between 700° C. and 900° C. in FG.

23. The method of claim 18, wherein step (a) comprises annealing the semiconductor layer surface in FG for between 10 and 50 seconds.

24. The method of claim 18, wherein step (b) comprises annealing the semiconductor layer surface between 750° C. and 950° C. in $N_2$.

25. The method of claim 18, wherein step (b) comprises annealing the semiconductor layer surface in $N_2$ for between 10 and 50 seconds.

26. The method of claim 18, wherein step (d) comprises annealing the semiconductor layer surface in FG.

* * * * *